US012620547B2

(12) United States Patent
De Langen et al.

(10) Patent No.: US 12,620,547 B2
(45) Date of Patent: May 5, 2026

(54) BEAM MANIPULATOR IN CHARGED PARTICLE-BEAM EXPOSURE APPARATUS

(71) Applicant: ASML Netherlands B.V., Veldhoven (NL)

(72) Inventors: Johannes Cornelis Jacobus De Langen, Delft (NL); Dmitry Mudretsov, Delft (NL); Dongbin Cai, The Hague (NL)

(73) Assignee: ASML Netherlands B.V., Veldhoven (NL)

(*) Notice: Subject to any disclaimer, the term of this patent is extended or adjusted under 35 U.S.C. 154(b) by 599 days.

(21) Appl. No.: 17/909,751

(22) PCT Filed: Feb. 24, 2021

(86) PCT No.: PCT/EP2021/054583
§ 371 (c)(1),
(2) Date: Sep. 6, 2022

(87) PCT Pub. No.: WO2021/175678
PCT Pub. Date: Sep. 10, 2021

(65) Prior Publication Data
US 2023/0124558 A1     Apr. 20, 2023

(30) Foreign Application Priority Data

Mar. 6, 2020     (EP) ..................................... 20161464

(51) Int. Cl.
*H01J 37/147*        (2006.01)
*G03F 7/20*          (2006.01)
*H01J 37/28*         (2006.01)

(52) U.S. Cl.
CPC ........ *H01J 37/1477* (2013.01); *G03F 7/2059* (2013.01); *H01J 37/28* (2013.01); *H01J 2237/0262* (2013.01); *H01J 2237/151* (2013.01)

(58) Field of Classification Search
None
See application file for complete search history.

(56) References Cited

U.S. PATENT DOCUMENTS

| 5,214,289 A | 5/1993 | Betsui |
| 6,586,736 B1 | 7/2003 | McCord |
| | (Continued) | |

FOREIGN PATENT DOCUMENTS

| CN | 102460630 A | 5/2012 |
| CN | 103620693 A | 3/2014 |
| | (Continued) | |

OTHER PUBLICATIONS

English machine translation for JP-2005149819-A (Year: 2005).*
(Continued)

*Primary Examiner* — Robert H Kim
*Assistant Examiner* — Alina Kaliszewski
(74) *Attorney, Agent, or Firm* — FINNEGAN, HENDERSON, FARABOW, GARRETT & DUNNER, LLP

(57) ABSTRACT

An improved electron beam manipulator for manipulating an electron beam in an electron projection system and a method for manufacturing thereof are disclosed. The electron beam manipulator comprises a body having a first surface and a second surface opposing to the first surface and an interconnecting surface extending between the first surface and the second surface and forming an aperture through (Continued)

the body. The body comprises an electrode forming at least part of the interconnecting surface between the first surface and the second surface.

19 Claims, 18 Drawing Sheets

(56) References Cited

U.S. PATENT DOCUMENTS

| | | | |
|---|---|---|---|
| 6,617,595 B1 | 9/2003 | Okunuki | |
| 6,914,249 B2 * | 7/2005 | Kienzle | H01J 37/3175 |
| | | | 250/311 |
| 7,135,676 B2 * | 11/2006 | Nakasuji | H01J 37/185 |
| | | | 250/307 |
| 7,714,298 B2 | 5/2010 | Platzgummer | |
| 9,754,759 B2 * | 9/2017 | Cook | H01J 37/147 |
| 2004/0169147 A1 | 9/2004 | Ono et al. | |
| 2005/0035300 A1 * | 2/2005 | Iwasaki | B82Y 10/00 |
| | | | 250/492.2 |
| 2005/0263713 A1 | 12/2005 | Iwasaki et al. | |
| 2007/0075257 A1 | 4/2007 | Kametani et al. | |
| 2008/0017807 A1 * | 1/2008 | Nagae | B82Y 40/00 |
| | | | 250/400 |
| 2010/0019166 A1 | 1/2010 | Kim et al. | |
| 2010/0187434 A1 | 7/2010 | Platzgummer et al. | |
| 2010/0288938 A1 * | 11/2010 | Platzgummer | H01J 37/3174 |
| | | | 250/396 R |
| 2012/0205537 A1 * | 8/2012 | Jiang | H01J 37/1477 |
| | | | 250/307 |
| 2012/0273690 A1 | 11/2012 | Wieland et al. | |
| 2012/0305798 A1 | 12/2012 | Zonnevylle et al. | |
| 2015/0340195 A1 * | 11/2015 | Brodie | H01J 37/045 |
| | | | 156/60 |
| 2016/0314930 A1 * | 10/2016 | Yamada | H01J 37/045 |
| 2022/0406563 A1 * | 12/2022 | Del Tin | H01J 37/09 |

FOREIGN PATENT DOCUMENTS

| | | | | |
|---|---|---|---|---|
| CN | 103650097 A | | 3/2014 | |
| CN | 113169008 A | * | 7/2021 | .............. H01J 37/08 |
| EP | 1383158 A2 | * | 1/2004 | ......... H01J 37/3177 |
| EP | 1987535 B1 | * | 6/2011 | ....... H01L 21/76898 |
| EP | 2715768 B1 | * | 1/2020 | ............ B82Y 10/00 |
| EP | 3872836 A1 | * | 9/2021 | ......... H01J 37/3177 |
| JP | H02-94346 | | 4/1990 | |
| JP | H02-100250 | | 4/1990 | |
| JP | 2816849 B2 | | 10/1998 | |
| JP | 2004055166 A | | 2/2004 | |
| JP | 2005064097 A | | 3/2005 | |
| JP | 2005123264 A | | 5/2005 | |
| JP | 2005136114 A | | 5/2005 | |
| JP | 2005142101 A | | 6/2005 | |
| JP | 2005149819 A | * | 6/2005 | |
| JP | 2006/013390 A | | 1/2006 | |
| JP | 2006019438 A | | 1/2006 | |
| JP | 2007103627 A | * | 4/2007 | ......... H01J 37/1477 |
| JP | 4150363 B2 | | 9/2008 | |
| JP | 4532184 B2 | | 8/2010 | |
| JP | 4627454 B2 | | 2/2011 | |
| JP | 4673170 B2 | | 4/2011 | |
| JP | 2012525933 A | * | 10/2012 | ......... A61B 18/1492 |
| JP | 2015225707 A | * | 12/2015 | .............. H01J 37/30 |
| JP | 7316106 B2 | * | 7/2023 | .............. H01J 37/28 |
| WO | WO-0118843 A1 | * | 3/2001 | ............ H01J 37/026 |
| WO | WO-2010125526 A1 | * | 11/2010 | .............. H01J 37/10 |
| WO | WO-2014186122 A2 | * | 11/2014 | ......... A61N 1/0529 |
| WO | WO-2021123082 A1 | * | 6/2021 | .............. H01J 37/28 |
| WO | WO-2021175678 A1 | * | 9/2021 | ......... G03F 7/2059 |

OTHER PUBLICATIONS

English machine translation for JP-2007103627-A (Year: 2007).*
English machine translation for JP-2012525933-A (Year: 2012).*
English machine translation for JP-2015225707-A (Year: 2015).*
English machine translation for CN-113169008-A (Year: 2021).*
English machine translation for JP-7316106-B2 (Year: 2023).*

* cited by examiner

100

40

400

500

700

800

1000

1000

1100

1100'

1300

BEAM MANIPULATOR IN CHARGED PARTICLE-BEAM EXPOSURE APPARATUS

CROSS-REFERENCE TO RELATED APPLICATIONS

This application claims priority to International Application No. PCT/EP2021/054583, filed 24 Feb. 2021, and published as WO 2021/175678 A1, which claims priority of EP Application Serial No. 20161464.1, which was filed on 6 Mar. 2020. The contents of these applications are incorporated herein by reference in their entireties.

FIELD

The embodiments provided herein generally relate to a charged particle beam illumination apparatus, and more particularly to a charged particle beam manipulator in a charged particle-beam illumination apparatus.

BACKGROUND

When manufacturing semiconductor integrated circuit (IC) chips, undesired pattern defects, as a consequence of, for example, optical effects and incidental particles, inevitably occur on a substrate (i.e., wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an import process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause electrons to be emitted from the surface, such as secondary electrons, backscattered electrons, or Auger electrons. The generated secondary electrons may be emitted from the material structure of the sample. By scanning the primary electron beam as the probing spot over the sample surface, secondary electrons can be emitted across the surface of the sample. By collecting these emitted secondary electrons from the sample surface, a pattern inspection tool may obtain an image representing characteristics of the material structure of the surface of the sample.

Another application for a charged particle beam is lithography. The charged particle beam reacts with a resist layer on the surface of a substrate. A desired pattern in the resist can be created by controlling the locations on the resist layer that the charged particle beam is directed towards.

There is a general need to improve the generation of a charged particle beam for use in electron microscopy as well as for other applications, such as lithography.

SUMMARY

The embodiments provided herein disclose a charged particle beam illumination apparatus. The charged particle beam illumination apparatus may be used to generate a multi-beam of charged particles. The charged particle beam illumination apparatus may be comprised within an inspection apparatus or a lithography apparatus.

In some embodiments, an electron beam manipulator for manipulating an electron beam in an electron projection system is provided. The electron beam manipulator comprises a body having a first surface and a second surface opposing to the first surface and an interconnecting surface extending between the first surface and the second surface and forming an aperture through the body. The body comprises an electrode forming at least part of the interconnecting surface between the first surface and the second surface.

In some embodiments, an electron beam manipulator device for manipulating an electron beam in an electron projection system is provided. The electron beam manipulating device comprises a first manipulator and a second manipulator. Each of the first manipulator and the second manipulator comprises a body having a first surface and a second surface opposing to the first surface and an interconnecting surface extending between the first surface and the second surface and forming an aperture through the body. The body comprises an electrode forming at least part of the interconnecting surface between the first surface and the second surface. At least part of the electrode is associated with the aperture and is positioned on the first surface. The first manipulator is positioned upstream of the second manipulator in a direction of the electron beam during operation.

In some embodiments, a method for manufacturing an electron beam manipulator is provided. The method comprises providing a workpiece comprising a substrate having a first surface and a second surface and an electrode layer formed relative to the first surface, the electrode layer having an electrode portion, forming a resist mask having an opening corresponding to a pattern on the workpiece, leaving an unmasked portion of the substrate, etching the unmasked portion of the substrate such that an inner wall is formed through the substrate to extend between the first surface and the second surface, removing the resist mask, and forming a first conductive layer coating the inner wall of the substrate.

In some embodiments, a method for manufacturing an electron beam manipulator is provided. The method comprises providing a workpiece comprising a conductive substrate having a first surface and a second surface, forming an isolation layer extending between the first surface and the second surface and electrically isolating a first substrate portion from a second substrate portion, the first substrate portion being positioned radially inward from the second substrate portion, and etching a part of the first substrate portion such that an inner wall extends through the substrate between the first surface and the second surface, the inner wall providing at least an electrode surface.

In some embodiments, an electron beam manipulator configured to manipulate an electron beam in a projection system of an electron beam tool is provided. The charged particle beam manipulator comprises a substrate having opposing major surfaces and through opening providing an interconnecting surface extending between the major surfaces. At least part of the interconnecting surface is defined by one or more electrodes.

In some embodiments, an electron beam manipulator configured to manipulate an electron beam in a projection system of an electron beam tool is provided. The charged particle beam manipulator comprises a substrate having opposing major surfaces and an electrode. The electrode forms at least part of a surface of an interconnecting-through-hole extending between the major surfaces, the through-hole forming an opening in each of the major surfaces. The electrode forms at least part of one of the two major surfaces surrounding one of the openings.

In some embodiments, an electron beam manipulator configured to manipulate an electron beam in a projection system of an electron beam tool is provided. The charged particle beam manipulator comprises a substrate having opposing major surfaces and a through-passage providing an interconnecting surface extending between the major surfaces. At least part of the interconnecting surface is formed by an electrode configured in use to be held at a potential difference.

In some embodiments, an electron beam manipulator configured to manipulate an electron beam in a projection system of an electron beam tool is provided. The charged particle beam manipulator comprises a substrate body having opposing major surfaces and a through-passage having an interconnecting surface extending between the major surfaces. At least part of the interconnecting surface is recessed: between adjoining edges of at least one electrode; and into the substrate body deeper than the thickness of the at least one electrode.

Other advantages of the embodiments of the present disclosure will become apparent from the following description taken in conjunction with the accompanying drawings wherein are set forth, by way of illustration and example, certain embodiments of the present disclosure.

BRIEF DESCRIPTION OF FIGURES

The above and other aspects of the present disclosure will become more apparent from the description of exemplary embodiments, taken in conjunction with the accompanying drawings.

DETAILED DESCRIPTION

Figure 1:
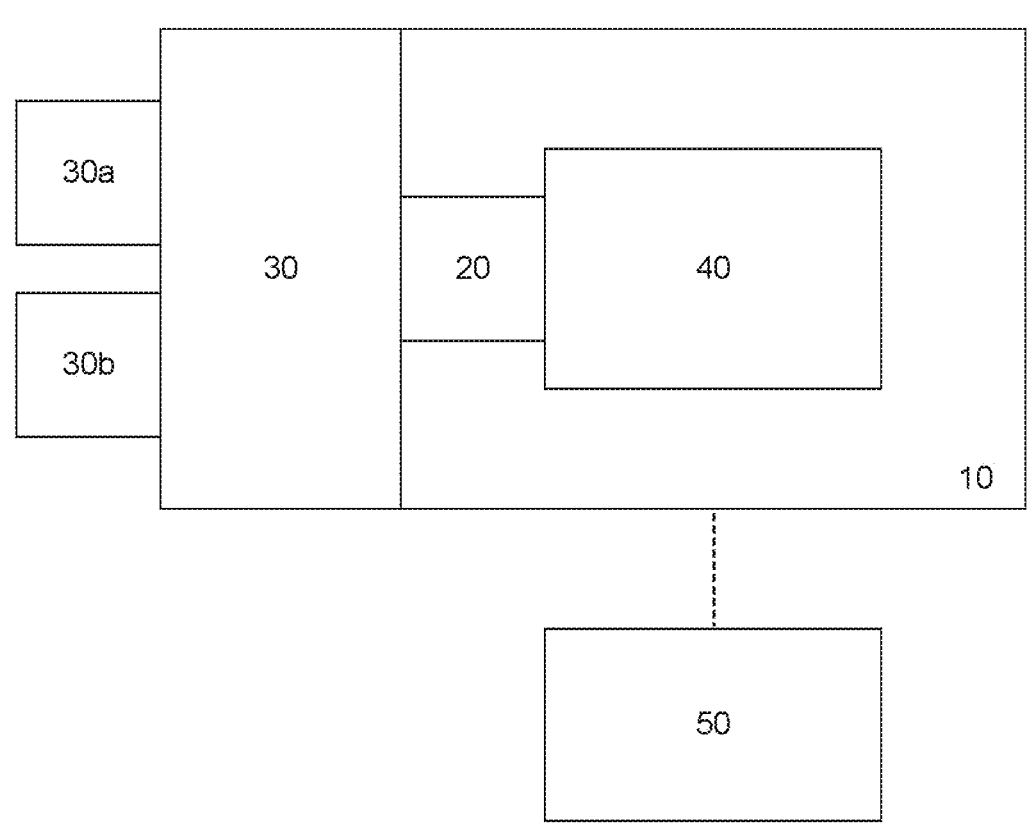
FIG. 1 is a schematic diagram illustrating an exemplary charged particle beam inspection apparatus.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail, may include over 2 billion transistors, the size of each transistor being less than $\frac{1}{1000}$th of a human hair. Thus, it is not surprising that semiconductor IC manufacturing is a complex and time-consuming process, with hundreds of individual steps. Errors in even one step have the potential to dramatically affect the functioning of the final product. Just one "killer defect" can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If an individual step has a yield of 95%, the overall process yield would be as low as 7%.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur.

While high process yield is desirable in an IC chip manufacturing facility, maintaining a high substrate (i.e. wafer) throughput, defined as the number of substrates processed per hour, is also essential. High process yield and high substrate throughput can be impacted by the presence of a defect. This is especially if operator intervention is required for reviewing the defects. Thus, high throughput detection and identification of micro and nano-scale defects by inspection tools (such as a SEM) is essential for maintaining high yield and low cost).

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e. a multi-beam, of primary electrons. The component beams of the multi-beam may be referred to as sub-beams or beamlets. A multi-beam can scan different parts of a sample simultaneously. A multi-beam inspection apparatus can therefore inspect a sample at a much higher speed than a single-beam inspection apparatus.

In a multi-beam inspection apparatus, the paths of some of the primary electron beams are displaced away from the central axis, i.e. a mid-point of the primary electron optical axis, of the scanning device. To ensure all the electron beams arrive at the sample surface with substantially the same angle of incidence, sub-beam paths with a greater radial distance from the central axis need to be manipulated to move through a greater angle than the sub-beam paths with paths closer to the central axis. This stronger manipulation may cause aberrations which result in blurry and out-of-focus images of the sample substrate. In particular, for sub-beam paths that are not on the central axis, the aberrations in the sub-beams may increase with the radial displacement from the central axis. Such aberrations may remain associated with the secondary electrons when they are detected. Such aberrations therefore degrade the quality of images that are created during inspection.

The figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons throughout the present document may therefore be generally considered as references to charged particles, with the charged particles not necessarily being electrons.

Reference is made to FIG. 1, which is a schematic diagram illustrating an exemplary charged particle beam inspection apparatus 100. The charged particle beam inspection apparatus 100 of FIG. 1 includes a main chamber 10, a load lock chamber 20, an electron beam tool 40, an equipment front end module (EFEM) 30 and a controller 50. The electron beam tool 40 is located within the main chamber 10.

While the description and drawings are directed to an electron beam, it is appreciated that the embodiments are not used to limit the present disclosure to specific charged particles.

The EFEM 30 includes a first loading port 30a and a second loading port 30b. The EFEM 30 may include additional loading port(s). The first loading port 30a and the second loading port 30b may, for example, receive substrate front opening unified pods (FOUPs) that contain substrates (e.g., semiconductor substrates or substrates made of other material(s)) or samples to be inspected (substrates, wafers, and samples are collectively referred to as "samples" hereafter). One or more robot arms (not shown) in EFEM 30 transport the samples to the load lock chamber 20.

The load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber 20 to reach a first pressure below the atmospheric pressure. After reaching the first pressure, one or more robot arms (not shown) transport the sample from the load lock chamber 20 to the main chamber 10. The main chamber 10 is connected to a main chamber vacuum pump system (not shown). The main chamber vacuum pump system removes gas particles in the main chamber 10 so that the pressure in around the sample reaches a second pressure lower than the first pressure. After reaching the second pressure, the sample is transported to the electron beam tool by which it may be inspected. An electron beam tool 40 may comprise a multi-beam electron-optical apparatus.

The controller 50 is electronically connected to the electron beam tool 40. The controller 50 may be a processor (such as a computer) configured to control the charged particle beam inspection apparatus 100. The controller 50 may also include a processing circuitry configured to execute various signal and image processing functions. While the controller 50 is shown in FIG. 1 as being outside of the structure that includes the main chamber 10, the load lock chamber 20, and the EFEM 30, it is appreciated that the controller 50 may be part of the structure. The controller 50 may be located in one of the component elements of the charged particle beam inspection apparatus 100 or it can be distributed over at least two of the component elements. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, that operate under the second pressure.

Figure 2:
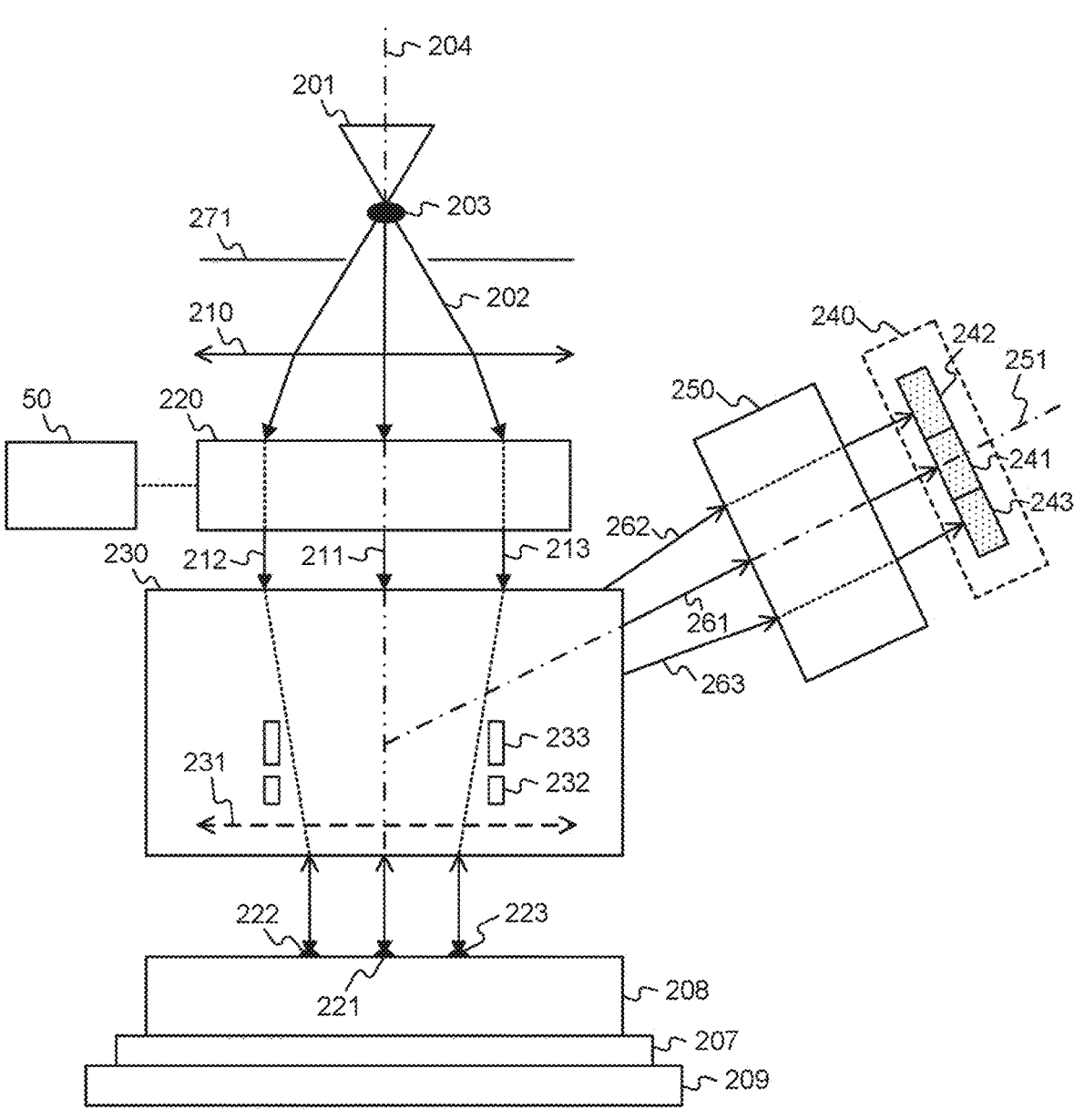
FIG. 2 is a schematic diagram illustrating an exemplary multi-beam apparatus that is part of the exemplary charged particle beam inspection apparatus.

Reference is now made to FIG. 2, which is a schematic diagram illustrating an exemplary electron beam tool 40 including a multi-beam inspection tool that is part of the exemplary charged particle beam inspection apparatus 100 of FIG. 1. Multi-beam electron beam tool 40 (also referred to herein as apparatus 40) comprises an electron source 201, a gun aperture plate 271, a condenser lens 210, a source conversion unit 220, a primary projection apparatus 230, a motorized stage 209, and a sample holder 207. The electron source 201, the gun aperture plate 271, the condenser lens 210, the source conversion unit 220 are the components of an illumination apparatus comprised by the multi-beam electron beam tool 40. The sample holder 207 is supported by motorized stage 209 so as to hold a sample 208 (e.g., a substrate or a mask) for inspection. Multi-beam electron beam tool 40 may further comprise a secondary projection apparatus 250 and an electron detection device 240. Primary projection apparatus 230 may comprise an objective lens 231. Electron detection device 240 may comprise a plurality of detection elements 241, 242, and 243. A beam separator 233 and a deflection scanning unit 232 may be positioned inside primary projection apparatus 230.

The components that are used to generate a primary beam may be aligned with a primary electron-optical axis of the apparatus 40. These components can include: the electron source 201, the gun aperture plate 271, the condenser lens 210, the source conversion unit 220, the beam separator 233, the deflection scanning unit 232, and the primary projection apparatus 230. Secondary projection apparatus 250 and its associated electron detection device 240 may be aligned with a secondary electron-optical axis 251 of apparatus 40.

The primary electron-optical axis 204 is comprised by the electron-optical axis of the of the part of electron beam tool 40 that is the illumination apparatus. The secondary electron-optical axis 251 is the electron-optical axis of the of the part of electron beam tool 40 that is a detection apparatus. The primary electron-optical axis 204 may also be referred to herein as the primary optical axis (to aid ease of reference) or charged particle optical axis. The secondary electron-optical axis 251 may also be referred to herein as the secondary optical axis or the secondary charged particle optical axis.

Electron source 201 may comprise a cathode (not shown) and an extractor or anode (not shown). During operation, electron source 201 is configured to emit electrons as primary electrons from the cathode. The primary electrons are extracted or accelerated by the extractor and/or the anode to form a primary electron beam 202 that forms a primary beam crossover (virtual or real) 203. Primary electron beam 202 may be visualized as being emitted from primary beam crossover 203.

In this arrangement a primary electron beam, by the time it reaches the sample, and preferably before it reaches the projection apparatus, is a multi-beam. Such a multi-beam can be generated from the primary electron beam in a number of different ways. For example, the multi-beam may be generated by a multi-beam array located before the cross-over, a multi-beam array located in the source conversion unit 220, or a multi-beam array located at any point in between these locations. A multi-beam array may comprise a plurality of electron beam manipulating elements arranged in an array across the beam path. Each manipulating element may influence the primary electron beam to generate a sub-beam. Thus, the multi-beam array interacts with an incident primary beam path to generate a multi-beam path down-beam of the multi-beam array.

The gun aperture plate 271, in operation, is configured to block off peripheral electrons of primary electron beam 202 to reduce the Coulomb effect. The Coulomb effect may enlarge the size of each of probe spots 221, 222, and 223 of primary sub-beams 211, 212, 213, and therefore deteriorate inspection resolution. The gun aperture plate 271 may also be referred to as a coulomb aperture array.

The condenser lens 210 is configured to focus the primary electron beam 202. The condenser lens 210 may be designed to focus the primary electron beam 202 to become a parallel beam and be normally incident onto source conversion unit 220. The condenser lens 210 may be an adjustable condenser lens that may be configured so that the position of its first principle plane is movable. The adjustable condenser lens may be configured to be magnetic. The condenser lens 210 may be an anti-rotation condenser lens and/or it may be adjustable.

The source conversion unit 220 may comprise an image-forming element array, an aberration compensator array, a beam-limit aperture array, and a pre-bending micro-deflector array. The pre-bending micro-deflector array may deflect a plurality of primary sub-beams 211, 212, 213 of primary electron beam 202 to normally enter the beam-limit aperture array, the image-forming element array, and an aberration compensator array. In this arrangement, the image-forming element array may function as a multi-beam array to generate the plurality of sub-beams in the multi-beam path, i.e. primary sub-beams 211, 212, 213. The image forming array may comprise a plurality electron beam manipulators such as micro-deflectors micro-lenses (or a combination of both) to influence the plurality of primary sub-beams 211, 212, 213 of primary electron beam 202 and to form a plurality of parallel images (virtual or real) of primary beam crossover 203, one for each of the primary sub-beams 211, 212, and 213. The aberration compensator array may comprise a field curvature compensator array (not shown) and an astigmatism compensator array (not shown). The field curvature compensator array may comprise a plurality of micro-lenses to compensate field curvature aberrations of the primary sub-beams 211, 212, and 213. The astigmatism compensator array may comprise a plurality of micro-stigmators to compensate astigmatism aberrations of the primary sub-beams 211, 212, and 213. The beam-limit aperture array may be configured to limit diameters of individual primary sub-beams 211, 212, and 213. FIG. 2 shows the three primary sub-beams 211, 212, and 213 as an example, and it should be understood that the source conversion unit 220 may be configured to form any number of primary sub-beams. The controller 50 may be connected to various parts of charged particle beam inspection apparatus 100 of FIG. 1, such as the source conversion unit 220, the electron detection device 240, the primary projection apparatus 230, or the motorized stage 209. As explained in further detail below, the controller 50 may perform various image and signal processing functions. The controller 50 may also generate various control signals to govern operations of the charged particle beam inspection apparatus, including the charged particle multi-beam apparatus.

The condenser lens 210 may further be configured to adjust electric currents of primary sub-beams 211, 212, 213 down-beam of the source conversion unit 220 by varying the focusing power of the condenser lens 210. Alternatively, or additionally, the electric currents of the primary sub-beams 211, 212, 213 may be changed by altering the radial sizes of beam-limit apertures within the beam-limit aperture array corresponding to the individual primary sub-beams. The electric currents may be changed by both altering the radial sizes of beam-limit apertures and the focusing power of the condenser lens 210. If the condenser lens is adjustable and magnetic, off-axis sub-beams 212 and 213 may result that illuminate the source conversion unit 220 with rotation angles. The rotation angles change with the focusing power or the position of the first principal plane of the movable condenser lens. The condenser lens 210 that is an anti-rotation condenser lens may be configured to keep the rotation angles unchanged while the focusing power of the condenser lens 210 is changed. Such a condenser lens 210 that is also adjustable, may cause the rotation angles to not change when the focusing power of the condenser lens 210 and the position of its first principal plane are varied.

The objective lens 231 may be configured to focus sub-beams 211, 212, and 213 onto the sample 208 for inspection and may form the three probe spots 221, 222, and 223 on the surface of sample 208.

Beam separator 233 may, for example, be a Wien filter comprising an electrostatic deflector generating an electrostatic dipole field and a magnetic dipole field (not shown in FIG. 2). In operation, beam separator 233 may be configured to exert an electrostatic force by electrostatic dipole field on individual electrons of primary beamlets 211, 212, and 213. The electrostatic force is equal in magnitude but opposite in direction to the magnetic force exerted by magnetic dipole field of beam separator 233 on the individual electrons. Primary beamlets 211,212, and 213 may therefore pass at least substantially straight through beam separator 233 with at least substantially zero deflection angles.

The deflection scanning unit 232, in operation, is configured to deflect the primary sub-beams 211, 212, and 213 to scan the probe spots 221, 222, and 223 across individual scanning areas in a section of the surface of the sample 208. In response to incidence of the primary sub-beams 211, 212, and 213 or the probe spots 221, 222, and 223 on sample 208, electrons are generated from the sample 208 and include secondary electrons and backscattered electrons. The secondary electrons propagate in three secondary electron beams 261, 262, and 263. The secondary electron beams 261, 262, and 263 typically have secondary electrons (having electron energy ≤50 eV) and may also have at least some of the backscattered electrons (having electron energy between 50 eV and the landing energy of primary sub-beams 211, 212, and 213). The beam separator 233 is arranged to deflect the path of the secondary electron beams 261, 262, and 263 towards the secondary projection apparatus 250. The secondary projection apparatus 250 subsequently focuses the path of secondary electron beams 261, 262, and 263 onto a plurality of detection regions 241, 242, and 243 of electron detection device 240. The detection regions may be separate detection elements 241, 242, and 243 that are arranged to detect corresponding secondary electron beams 261, 262, and 263. The detection regions generate corresponding signals, which are sent to the controller 50 or a signal processing system (not shown), e.g. to construct images of the corresponding scanned areas of the sample 208.

The detection elements 241, 242, and 243 may detect the corresponding secondary electron beams 261, 262, and 263. On incidence of secondary electron beams with the detection elements 241, 242 and 243, the elements may generate corresponding intensity signal outputs (not shown). The outputs may be directed to an image processing system (e.g., controller 50). Each detection element 241, 242, and 243 may comprise one or more pixels. The intensity signal output of a detection element may be a sum of signals generated by all the pixels within the detection element.

The controller 50 may comprise image processing system that includes an image acquirer (not shown) and a storage device (not shown). For example, the controller may comprise a processor, computer, server, mainframe host, terminals, personal computer, any kind of mobile computing devices, and the like, or a combination thereof. The image acquirer may comprise at least part of the processing function of the controller. Thus, the image acquirer may comprise at least one or more processors. The image acquirer may be communicatively coupled to the electron detection device 240 of the apparatus 40 permitting signal communication, such as an electrical conductor, optical fiber cable, portable storage media, IR, Bluetooth, internet, wireless network, wireless radio, among others, or a combination thereof. The image acquirer may receive a signal from the electron detection device 240, may process the data comprised in the signal and may construct an image therefrom. The image acquirer may thus acquire images of the sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The image acquirer may acquire one or more images of a sample based on an imaging signal received from the electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time period. The multiple images may be stored in the storage. The controller 50 may be configured to perform image processing steps with the multiple images of the same location of sample 208.

The controller 50 may include measurement circuitry (e.g., analog-to-digital converters) to obtain a distribution of the detected secondary electrons. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of sample 208. The reconstructed images can thereby be used to reveal any defects that may exist in the sample.

The controller 50 may control the motorized stage 209 to move the sample 208 during inspection of the sample 208. The controller 50 may enable the motorized stage 209 to move the sample 208 in a direction, preferably continuously, for example at a constant speed, at least during sample inspection. The controller 50 may control movement of the motorized stage 209 so that it changes the speed of the movement of the sample 208 dependent on various parameters. For example, the controller may control the stage speed (including its direction) depending on the characteristics of the inspection steps of scanning process.

Although FIG. 2 shows that the apparatus 40 uses three primary electron sub-beams, it is appreciated that the apparatus 40 may use two or more number of primary electron sub-beams. The present disclosure does not limit the number of primary electron beams used in the apparatus 40.

Figure 3A:
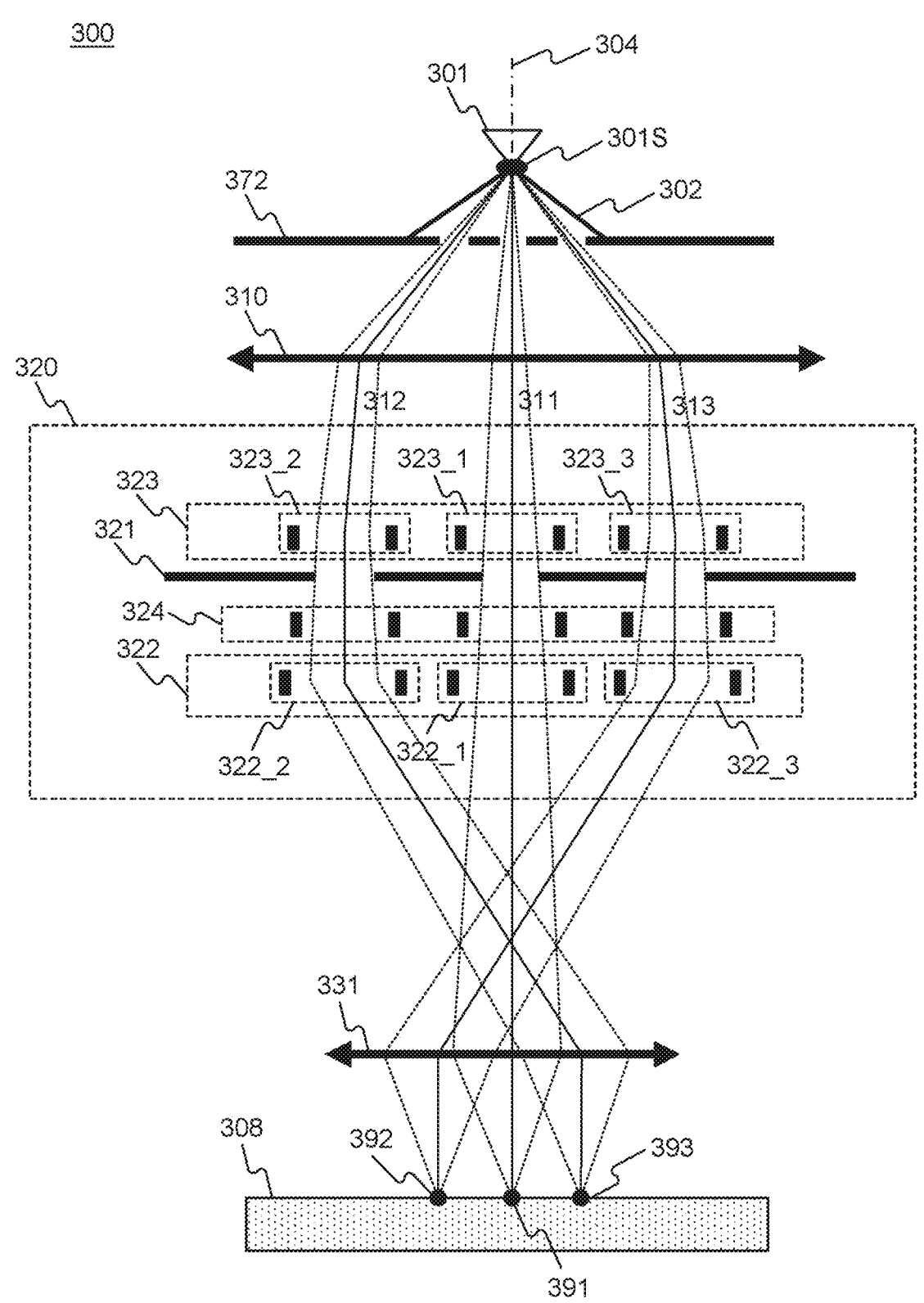
FIG. 3A is a schematic diagram of exemplary multi-beam apparatus illustrating an exemplary configuration of source conversion unit of the exemplary charged particle beam inspection apparatus of FIG. 1.

Reference is now made to FIG. 3A, which is a schematic diagram of exemplary multi-beam apparatus illustrating an exemplary configuration of source conversion unit of the exemplary charged particle beam inspection apparatus of FIG. 1. The apparatus 300 may comprise an election source 301, a pre-sub-beam-forming aperture array 372, a condenser lens 310 (similar to condenser lens 210 of FIG. 2), a source conversion unit 320, an objective lens 331 (similar to objective lens 231 of FIG. 2), and a sample 308 (similar to sample 208 of FIG. 2). The election source 301, the pre-sub-beam-forming aperture array 372, the condenser lens 310 may be the components of an illumination apparatus comprised by the apparatus 300. The source conversion unit 320 and the objective lens 331 may be the components of a projection apparatus comprised by the apparatus 300. The source conversion unit 320 may be similar to source conversion unit 220 of FIG. 2 in which the image-forming element array of FIG. 2 is image-forming element array 322, the aberration compensator array of FIG. 2 is aberration compensator array 324, the beam-limit aperture array of FIG. 2 is beam-limit aperture array 321, and the pre-bending micro-deflector array of FIG. 2 is pre-bending micro-deflector array 323. The election source 301, the pre-sub-beam-forming aperture array 372, the condenser lens 310, the source conversion unit 320 and the objective lens 331 are aligned with a primary electron-optical axis 304 of the apparatus. The electron source 301 generates a primary-electron beam 302 generally along the primary electron-optical axis 304 and with a source crossover (virtual or real) 301S. The pre-sub-beam-forming aperture array 372 cuts the peripheral electrons of primary electron beam 302 to reduce a consequential Coulomb effect. The Coulomb effect is a source of aberration to the sub-beams due to interaction between electrons in different sub-beam paths. Primary-electron beam 302 may be trimmed into a specified number of sub-beams, such as three sub-beams 311, 312 and 313 by the pre-sub-beam-forming aperture array 372 of a pre-sub-beam-forming mechanism. Although three sub-beams and their paths are referred to in the previous and following description, it should be understood that the description is intended to apply an apparatus, tool, or system with any number of sub-beams.

The source conversion unit 320 may include a beamlet-limit aperture array 321 with beam-limit apertures configured to limit the sub-beams 311, 312, and 313 of the primary electron beam 302. The source conversion unit 320 may also include an image-forming element array 322 with image-forming micro-deflectors, 322_1, 322_2, and 322_3. There is a respective micro-deflector associated with the path of each sub-beam. The micro-deflectors 322_1, 322_2, and 322_3 are configured to deflect the paths of the sub-beams 311, 312, and 313 towards the electron-optical axis 304. The deflected sub-beams 311, 312 and 313 form virtual images of source crossover 301S. The virtual images are projected onto the sample 308 by the objective lens 331 and form probe spots thereon, which are the three probe spots, 391, 392, and 393. Each probe spot corresponds to the location of incidence of a sub-beam path on the sample surface. The source conversion unit 320 may further comprise an aberration compensator array 324 configured to compensate aberrations of each of the sub-beams. The aberrations in each sub-beam are typically present on the probe spots, 391, 392, and 393 that would be formed a sample surface. The aberration compensator array 324 may include a field curvature compensator array (not shown) with micro-lenses. The field curvature compensator and micro-lenses are configured to compensate the sub-beams for field curvature aberrations evident in the probe spots, 391, 392, and 393. The aberration compensator array 324 may include an astigmatism compensator array (not shown) with micro-stigmators. The micro-stigmators are controlled to operate on the sub-beams to compensate astigmatism aberrations that are otherwise present in the probe spots, 391, 392, and 393.

The source conversion unit 320 may further comprise a pre-bending micro-deflector array 323 with pre-bending micro-deflectors 323_1, 323_2, and 323_3 to bend the sub-beams 311, 312, and 313 respectively. The pre-bending micro-deflectors 323_1, 323_2, and 323_3 may bend the path of the sub-beams onto the beamlet-limit aperture array 321. The sub-beam path of the incident on beamlet-limit aperture array 321 may be orthogonal to the plane of orientation of the beamlet-limit aperture array 321. The condenser lens 310 may direct the path of the sub-beams onto the beamlet-limit aperture array 321. The condenser lens 310 may focus the three sub-beams 311, 312, and 313 to become parallel beams along the primary electron-optical axis 304, so that it is perpendicularly incident onto the source conversion unit 320, which may correspond to the beamlet-limit aperture array 321.

The image-forming element array 322, the aberration compensator array 324, and the pre-bending micro-deflector array 323 may comprise multiple layers of sub-beam manipulating devices, some of which may be in the form or arrays, for example: micro-deflectors, micro-lenses, or micro-stigmators.

In the source conversion unit 320, the sub-beams 311, 312 and 313 of the primary electron beam 302 are respectively deflected by the micro-deflectors 322_1, 322_2 and 322_3 of image-forming element array 322 towards the primary electron-optical axis 304. It should be understood that the path of sub-beam 311 may already correspond to the electron-optical axis 304 prior to reaching micro-deflector 322_1, accordingly the path of sub-beam 311 may not be deflected by micro-deflector 322_1.

The objective lens 331 focuses the sub-beams onto the surface of the sample 308, i.e., it projects the three virtual images onto the sample surface. The three images formed by three sub-beams 311 to 313 on the sample surface form three probe spots 391, 392 and 393 thereon. The deflection angles of sub-beams 311 to 313 are adjusted by the objective lens 331 to reduce the off-axis aberrations of three probe spots 391-393. The three deflected sub-beams consequently pass through or approach the front focal point of objective lens 331.

At least some of the above-described components in FIG. 2 and FIG. 3A may individually, or in combination with each other, be referred to as a manipulator array, or manipulator, because they manipulate one or more beams, or sub-beams, of charged particles.

Figure 3B:
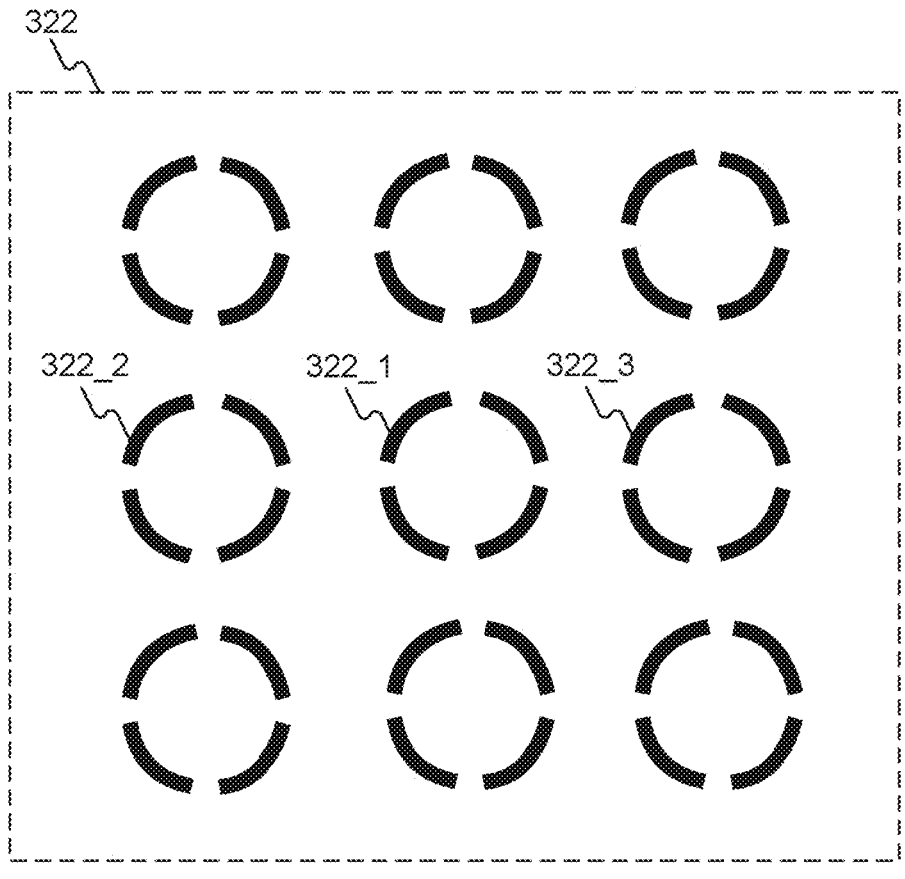
FIG. 3B is a schematic diagram of exemplary multi electrode structure array with a 3×3 configuration that is part of exemplary source conversion unit of FIG. 3A.

The above described multi-beam inspection tool comprises a multi-beam charged particle optical apparatus with a single source of charged particles. The charged particle optical apparatus comprises an illumination apparatus and a projection apparatus. The illumination apparatus may generate a multi-beam of charged particles from the beam of electrons from the source. The projection apparatus projects a multi-beam of charged particles towards a sample. At least part of the surface of a sample is scanned with the multi-beam of charged particles As an example of an array, a 3×3 image-forming micro-deflector array configuration that can deflect a total of nine beamlets simultaneously is illustrated in FIG. 3B. FIG. 3B illustrates that each of image-forming micro-deflectors 322_1, 322_2, or 322_3 comprises 4 electrodes. As the number of beamlets increases, the size of the array may tend to increase in size as well. Note although an array of nine deflector assemblies (generally manipulators) is shown, arrays can exist from this arrangement to five by five, seven by seven, eleven by eleven to as many as 5000 or more manipulators.

As shown above, a multi-beam projection tool such as SEM among other can include a great number of beam manipulators such as, but not limited to, micro-deflectors, micro-lenses, or micro-stigmators. As the physical sizes of IC components continue to shrink, accuracy of manipulating each of the beams in a multi-beam projection tool becomes more important. Even a small beam aberration caused by a micro beam manipulator can invoke a false defect detection from the finished IC, which can substantially degrade overall yield of the process. In SEM, multiple electron beams are aligned in the column with a small pitch (e.g., 300 micrometer or less) and every beam is manipulated by electric fields generated by electrodes of beam manipulators. Note that in this description an electrode is intended to refer to an electrically conductive element providing a surface that directly electro-statically interacts with the charged particles as the pass by the electrode along its beam or beamlet path. However, dielectric or electrically isolating material in the vicinity of electron beam passages can be charged and cause distortions of electric fields formed in the passages. Such electric field distortion can lead to degradation of electron-optical properties of beam manipulators. That is, electric field distortion can cause beam aberrations. To avoid such electric field distortion in beam manipulators, forming a uniform electric field in the beam passages of beam manipulators during operation can help alleviate these issues. This can be achieved by implementing uniform charge distribution on beam passage forming surfaces of beam manipulators.

Although beam manipulators are described with respect to a charged particle beam inspection system (e.g., SEM), the disclosure is not so limited. The present disclosure can be applied to beam manipulators utilized in other types of electron optical systems such as illumination systems, projection systems, charged-particle metrology tools, e-beam lithography tools, e-beam inspection systems, etc. It will be also appreciated that the present disclosure can be applied to embodiments in which multiple beam manipulators are aligned in an array, for example, illustrated in FIG. 3B while the disclosure will be explained with respect to one beam manipulator.

Figure 4A:
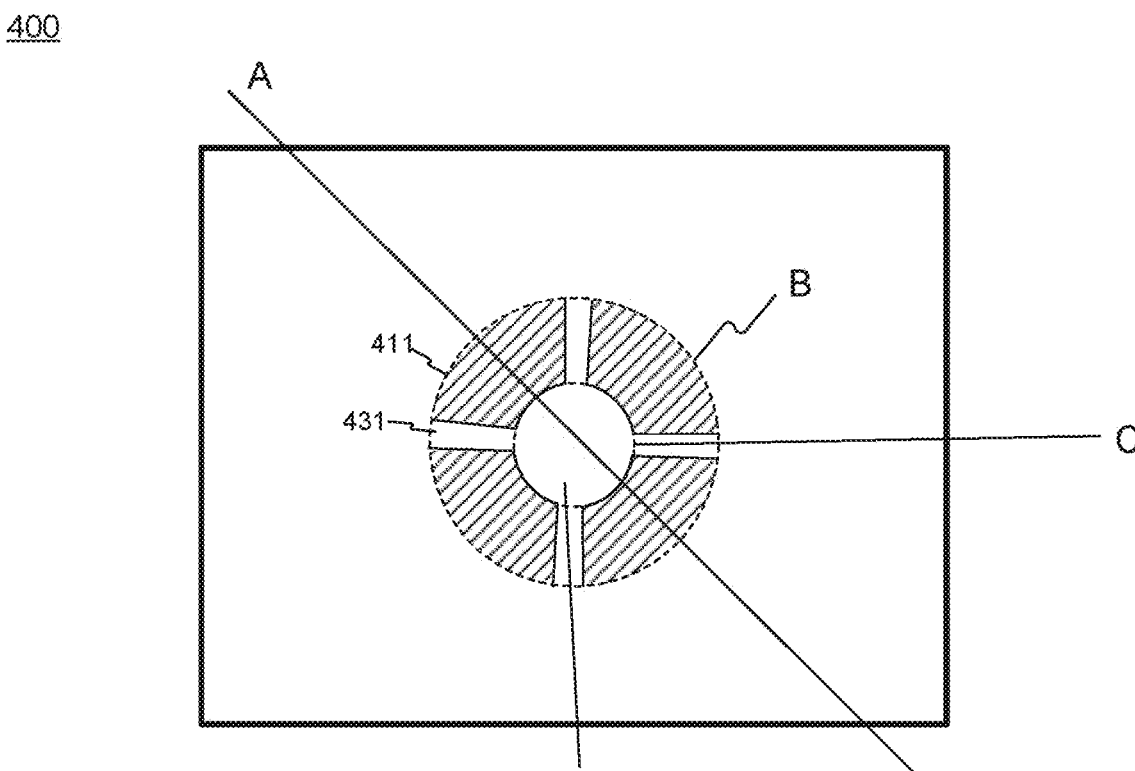
FIG. 4A is a schematic plan view of an exemplary beam manipulator, consistent with embodiments of the present disclosure.
Figure 4B:
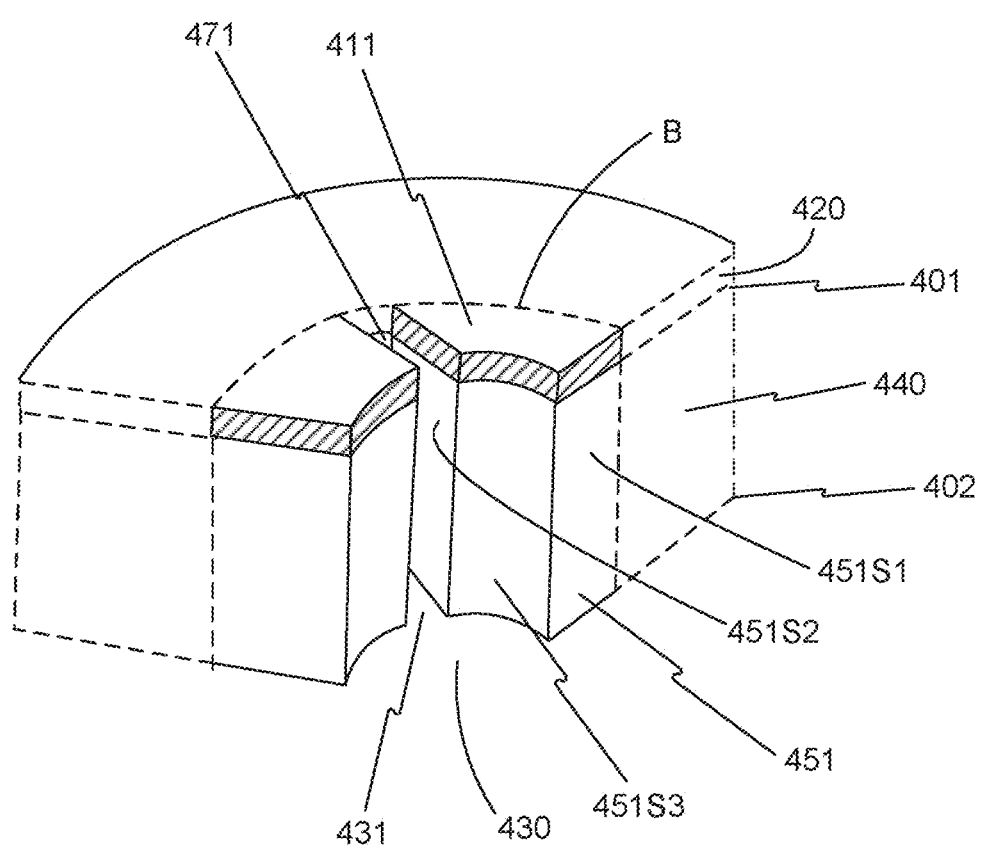
FIG. 4B is a schematic cross-sectional perspective view of the beam manipulator of FIG. 4A.

Reference is now made to FIG. 4A illustrating a schematic plan view of an exemplary beam manipulator, consistent with embodiments of the present disclosure. FIG. 4B is a schematic cross-sectional perspective view of the beam manipulator of FIG. 4A. A beam manipulator 400 of FIG. 4A can be formed based on an electrically non-conductive substrate in various embodiments. For example, a substrate can be a silicon substrate. As shown in FIG. 4B, a beam manipulator 400 may include a substrate 440 and one or more electrodes 411. An aperture 430 extending through two opposing surfaces of substrate 440 is formed in the substrate 440. The two opposing surfaces of substrate 440 can constitute major surfaces of substrate 440. The two opposing surfaces may include an upper surface 401 and a lower surface 402 of the substrate 440. In this disclosure, a term "upper" can refer to an upper side of a component and a term "lower" can refer to a lower side of a component. However, such terms are of convenience since a beam manipulator 400 need not be orientated in use in alignment with a gravitational field; the terms "upper" and "lower," and the like, may refer to the orientation of substrate 440 with the intended beam direction.

In some embodiments, one or more electrodes 411 can be formed around aperture 430 as shown in plan view in FIG. 4A. For example, one or more electrodes 411 can be positioned adjacent to aperture 430 and can be positioned in upper surface 401 of substrate 440. For example, aperture facing surfaces of one or more electrodes 411 can form a part of aperture 430. In FIG. 4A, the aperture facing surface of the electrode 411 is shown as a part of a rim defining the aperture 430 in the upper surface of the substrate. In some embodiments, the aperture 430 can have a substantially circular shape (e.g., boundary C). The one or more electrodes 411 extend radially outwardly from aperture 430. In some embodiments, the one or more electrodes 411 form a portion of upper surface 401. For example, the one or more electrodes 411 may be positioned between aperture 430 and a certain boundary (such as boundary B). In some embodiments, the certain boundary may surround the aperture 430. The certain boundary may be circular and the aperture 430 substantially surrounded by the circular boundary may be substantially circular.

In various embodiments where a beam manipulator 400 has a plurality of electrodes, such as four electrodes 411 as shown in FIG. 4A, two adjacent electrodes among the plurality of electrodes 411 may be spaced apart. Mutually facing surfaces of two adjacent electrodes may define a gap therebetween. For example, two facing surfaces of two adjacent electrodes may be spaced apart by a gap 431. In some embodiments, the facing surfaces defining gap 431 may be parallel as shown in FIG. 4A. In some other embodiments, the facing surfaces defining gap 431 may be radially diverging. Gap 431 may have a consistent tangential dimension along its radial length. In some embodiments, a gap (such as gap 431) can have a radial length longer than a radial length of electrode 411 to enhance electrical isolation between two adjacent electrodes. Here, a radial length of electrode 411 can correspond to a radial distance between boundary B to boundary C. It will be noted that the boundaries B and C are assumed to be continuous in that the gaps 431 do interfere or even disrupt boundaries B and C.

In some embodiments, gap 431 can extend through substrate 440 between upper surface 401 and lower surface 402 as shown in FIG. 4B. The gap 431 can extend through an entire length of the beam manipulator 400. Resulting from the gap 431 formed in the substrate 440, the substrate 440 can have one or more protruding portions 451. Each protruding portion 451 comprises its respective electrode 411, such that the electrode 411 provides at least one surface of the protruding portion 451 such as an upper surface of the electrode 411. Each protruding portion 451 is, in plan view, radially inwardly protruding from a base surface 471 of the substrate 440. In some embodiments, base surface 471 can an external, uncovered portion of the substrate 440's body. In some embodiments, the base surface 471 includes a substantially vertical surface extending between the lower surface and the electrode 411 that provides the upper surface of the substrate 440 and major surfaces of the substrate 440. In some embodiments, the base surface 471 may not be flat between the lower surface 402 and the electrode 411. The base surface 471 may be a surface uncovered by the gap 431 and positioned remote from the aperture 430 such that the gap 431 is open to the aperture 430 side and closed on the other side by the base surface 471. Base surface 471 may be positioned at or radially outside of boundary B relative to the aperture to enhance electrical isolation between two electrodes 411 on two adjacent protruding portions 451. In some embodiments, base surface 471 can extend from an upper surface of beam manipulator 400 to lower surface 402 of substrate 440. Each of the one or more protruding portions 451 has two or more side surfaces facing gaps adjacent to the corresponding protruding portion. For example, protruding portion 451 can have a first side surface 451S1 and a second side surface 451S2 that are surfaces of the protruding portion 451 extending through the substrate 440, apart from the radially inwardly facing aperture surface 451S3. In some embodiments, protruding portions 451 have aperture facing surfaces 451S3, each of which meets with first side surface 451S1 and with second side surface 451S2 of corresponding protruding portion 451. In some embodiments, each of the protruding portions 451 extends from the upper surface 401 to the lower surface 402 of the substrate 440.

According to embodiments of the present disclosure, while beam manipulator 400 is shown as having four electrodes 411 in FIG. 4A and FIG. 4B, it is appreciated that manipulator 400 can have any number of electrodes, for example, eight electrodes, ten electrodes, twelve electrode, and so on. In some embodiments, beam manipulator 400 can have a single electrode. A single electrode may have an annular, preferably ring, shaped surrounding aperture 430. In some embodiments, beam manipulator 400 may not include a gap, and aperture 430 can be formed along boundary C and can extend from an upper surface of beam manipulator 400 to lower surface 402 of substrate 440. In some other embodiments, beam manipulator 400 may include a gap (e.g., gap 431) separating two ends of the same electrode.

According to embodiments of the present disclosure, one or more beams can be manipulated by electric fields generated by beam manipulator 400. To generate electric fields to affect trajectories of one or more beams passing through aperture 430, electrodes 411 can be wired individually or collectively to a corresponding power source. The power source is generally positioned outside of an electron column of SEM. In some embodiments, an electric circuit configured to provide a driving voltage or control signal to electrodes 411 can be formed on a routing or wiring portion 420 of the upper surface 401 of the substrate 440. The power source can include a voltage driver.

Beam manipulator 400 including four electrodes such as in FIG. 4A can be configured in different ways to function differently. When all four electrodes are applied to one voltage potential, the beam manipulator 400 can function as a micro-lens. When the two pairs of opposite electrodes are applied to two voltages of the same absolute value but opposite polarity, the beam manipulator 400 can function as a micro-stigmator. For example, in FIG. 4A, when one pair of electrodes facing each other among the four electrodes 411 are applied to +V1 and the other pair of electrodes facing each other are applied to −V1, the beam manipulator may function as a micro-stigmator. When to one pair of opposite electrodes a zero voltage is applied, and to the other pair of opposite electrodes two voltages of the same absolute value but having opposite polarity are applied, the beam manipulator can function as a micro-deflector. For example, in FIG. 4A, the beam manipulator 400 can be operated to function as a micro-deflector in the following way. One pair of electrodes facing each other among the four electrodes 411 can be set at a ground potential, i.e. a potential of zero (0) volts. Of the other pair of electrodes that face each other, to one electrode is applied a potential of V2; and to the other electrode is applied a potential of −V2. A magnitude or polarity of a voltage applied to each of electrodes can be determined according to a target manipulation of a beam passing through the aperture 430. The target manipulation may be in terms of direction or degree of the manipulation of the beam as it passes through aperture 430. In some embodiments, controller 50 may be configured to control voltage levels, voltage polarities, voltage application timing, etc. for each electrode included in beam manipulator 400. The controller 50 can be configured to provide a digital signal to the electric circuit configured to provide a driving voltage or control signal to electrodes 411.

It will be noted that FIG. 4A and FIG. 4B illustrate simplified beam manipulator 400 omitting one or more elements constituting beam manipulator 400 and therefore various beam manipulators (e.g., 500, 800, etc., which appear later in the description) according to embodiments of the present disclosure can be explained or illustrated based on beam manipulator 400 shown in and described with respect to FIGS. 4A and 4B. Beam manipulator 400 may further include a shielding layer (not shown) positioned upstream of electrode 411 in a direction of an electron beam when operating. The shielding layer may enable avoiding that an electron beam charges an upper surface and/or a boundary (e.g., boundary B) formed on the upper surface. The shielding layer may shield each electron beam from other electron beam in a multiple electrode configuration. The shielding layer can be formed as a conductive layer. The shielding layer can be formed by coating a conductive layer on a non-conductive structure. The shielding layer can be included on any type of beam manipulators such as a beam manipulator 500, 800, 1000, 1100, 1100', or 1300 in FIG. 5, 10A, 11A, 11B, or 13 of the present disclosure. The shielding layer can be included in any type of stacked beam manipulating devices such as a stacked beam manipulating device 700 or 1400 in FIG. 7 or 14, where the shielding layer can be placed on an uppermost manipulator (e.g., 500 or 1300 in FIG. 7 or 14) in a direction of an electron beam during operation.

In the present disclosure, a beam manipulator may be described as including a main body and an electrode. In beam manipulator 400 of FIG. 4B, substrate 440 can form a main body of the beam manipulator 400 and electrode 411 can be an electrode of the beam manipulator 400. A main body can have a first surface and a second surface opposing the first surface and an interconnecting surface extending between the first surface and the second surface and defining an aperture through the body according to embodiments of the present disclosure.

Figure 5:
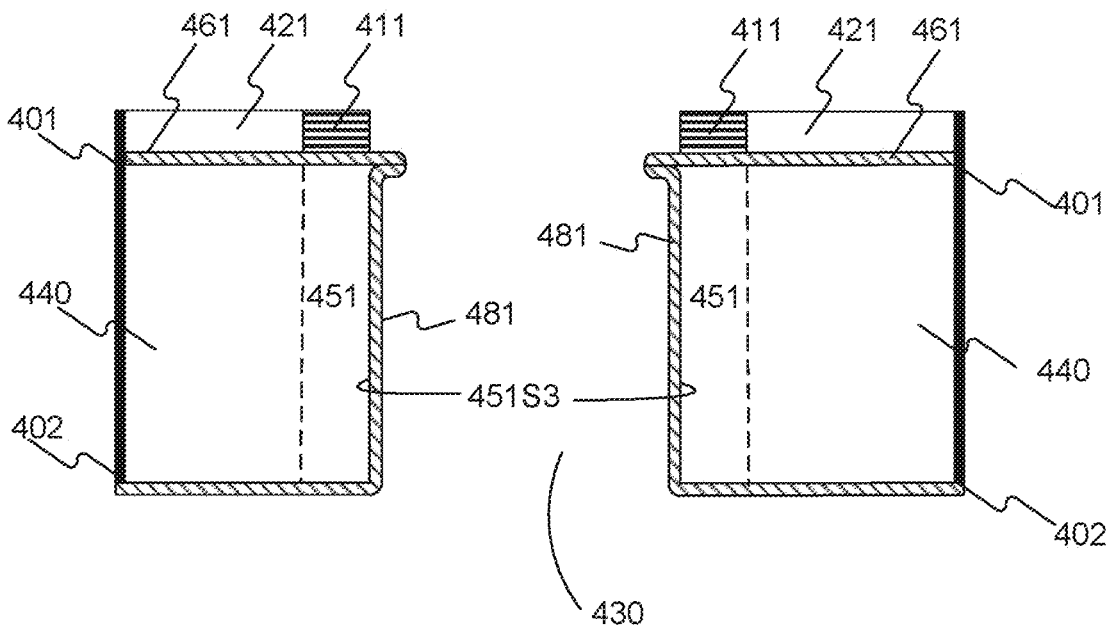
FIG. 5 is a cross section view of exemplary configurations of a beam manipulator, consistent with embodiments of the present disclosure.

Now reference is made to FIG. 5 illustrating a cross-section view of exemplary configurations of a beam manipulator 500, consistent with embodiments of the present disclosure. FIG. 5 may show a cross section view of a beam manipulator along an imaginary line A-A' in FIG. 4A. As shown in FIG. 5, beam manipulator 500 can have substrate 440 having upper surface 401 and lower surface 402 and aperture 430 defined therein according to embodiments of the present disclosure. Aperture 430 may extend from the upper surface 401 to the lower surface 402 of the substrate 440. In some embodiments, beam manipulator 500 may have one or more electrodes 411 around aperture 430 and may be positioned on upper surface 401 of substrate 440.

In some embodiments, two electrodes 411 shown in FIG. 5 may be electrically separated from each other. For example, the two electrodes 411 shown in FIG. 5 can constitute separate electrodes. In some embodiments, two electrodes 411 shown in FIG. 5 can be part of a single electrode surrounding aperture 430. In some other embodiments, two electrodes 411 shown in FIG. 5 can function as one electrode by electrically connecting the two electrodes 411.

According to embodiments of the present disclosure, substrate 440 may have aperture facing surfaces 451S3 extending from upper surface 401 to lower surface 402 and facing aperture 430. In some embodiments, aperture facing surfaces 451S3 can be configured to have a uniform charge distribution. In some embodiments, beam manipulator 500 can be configured to have uniform charge distribution on entire aperture facing surfaces 451S3 from upper surface 401 to lower surface 402 of substrate 440.

In some embodiments, two aperture facing surfaces 451S3 shown in FIG. 5 can be part of one continuous aperture facing surface of the substrate 440. In this example, beam manipulator 500 can include a single electrode and no gaps (e.g., gaps 431 of FIG. 4B) are formed in beam manipulator 500. In some embodiments, a plurality of gaps may be defined in beam manipulator 500 and the substrate 440 may include a plurality of protruding portions 451. Side surfaces (e.g., 451S1 and 451S2 of FIG. 4B) of the protruding portions 451 can also be configured to have even charge distribution between upper surface 401 and lower surface 402. The side surfaces of protruding portions 451 can have even charge distribution equal to even charge distribution of the aperture facing surfaces 451S3.

In some embodiments, aperture facing surfaces 451S3 of substrate 440 can be coated with a first conductive layer 481, consistent with embodiments of the present disclosure. A first conductive layer 481 may coat entire aperture facing surface 451S3 from upper surface 401 to lower surface 402 of substrate 440. The first conductive layer 481 may be a coating and/or may extend to at least part of lower surface 402 of the substrate 440. The first conductive layer 481 may provide a bottom surface of corresponding protruding portion 451, preferably as a coating. The first conductive layer 481 may cover the entire lower surface 402 of substrate 440.

The first conductive layer 481 may be configured to have an electric potential different from an electric potential of electrode 411. In order to avoid a short circuit between electrode 411 and first conductive layer 481 when forming first conductive layer 481, beam manipulator 500 can further include a second conductive layer 461 on at least part of upper surface 401 of the substrate 440. In some embodiments, second conductive layer 461 can be positioned between electrode and upper surface 401 of the substrate 440. According to embodiments of the present disclosure, first conductive layer 481 can be electrically connected with second conductive layer 461. In some embodiments, first conductive layer 481 can have the same electric potential with second conductive layer 461 when beam manipulator 500 is operating. For example, first conductive layer 481 and second conductive layer 461 can be electrically connected to a common power source via electric circuits through a routing portion 421. In some embodiments, first conductive layer 481 and/or second conductive layer 461 can function as a shielding layer. For example, first conductive layer 481 and second conductive layer 461 can be provided with a ground voltage. By shielding beam facing surface 451S3 of substrate 440, a distortion of an electric field in the aperture 430 by substrate material facing the aperture 430 can be avoided or reduced.

In beam manipulator 500 of FIG. 5, substrate 440, first conductive layer 481, and second conductive layer 461 can form a main body of the beam manipulator 500, and electrode 411 can be an electrode of the beam manipulator 500. According to embodiments of the present disclosure, a main body can comprise an elongated electrode that forms the interconnecting surface between the first surface and the second surface. In various embodiments including a beam manipulator (e.g., illustrated in FIG. 5), first conductive layer 481 can be an elongate electrode of the main body. In some embodiments, second conductive layer 461 can form a first surface of the main body. In some embodiments, beam manipulator 500 of FIG. 5 further includes an electrical isolator between second conductive layer 461 and electrode 411 so that different potentials can be applied to the second conductive layer 461 and electrode 411.

Figure 6:
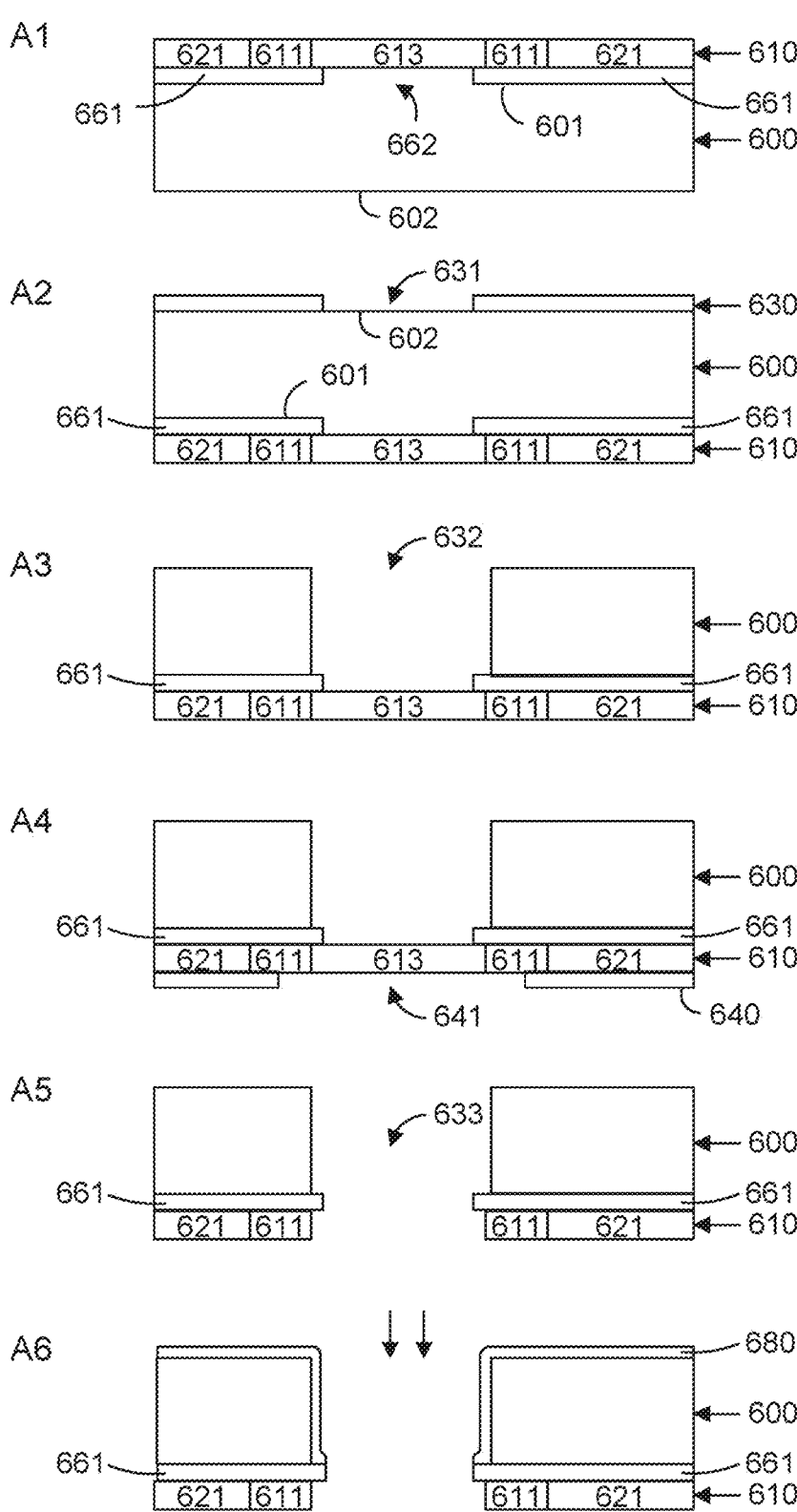
FIG. 6 illustrates an exemplary method of forming a beam manipulator of FIG. 5, consistent with embodiments of the present disclosure.

FIG. 6 illustrates an exemplary method of forming beam manipulator 500 of FIG. 5, consistent with embodiments of the present disclosure. As shown in FIG. 6, in step A1, a workpiece is provided. The workpiece can include a substrate 600 having a first surface 601 and a second surface 602, an electrode layer 610, and a conductive layer 661. The substrate 600 can be made of silicon, doped silicon, glass (e.g., pyrex), and so on.

Electrode layer 610 may be formed relative to first surface 601 of substrate 600. In some embodiments, electrode layer 610 may include electrode portions 611 spaced apart by a dielectric 613. According to embodiments, electrode portions 611 can be formed to constitute electrodes 411 in beam manipulator 500 of FIG. 5 upon completion of forming the beam manipulator 500. According to embodiments, dielectric 613 can have a pattern corresponding to an intended aperture (e.g., aperture 430 of FIG. 4A), which can have a substantially circular shape (e.g., boundary C) from a top view. In some embodiments where a plurality of electrodes are included in a beam manipulator, the pattern of dielectric 613 can be more spoke-shaped. For example, as shown in FIG. 4A, the pattern of dielectric 613 can include not only boundary C but also the patterns, e.g. the radially outwardly extending shapes from the boundary C, corresponding to gaps 431. In some embodiments, electrode layer 610 may further include a routing portion 621. In some embodiments, routing portion 621 can be positioned adjacent to electrode portion 611 and outer to the electrode portion 611 with respect to the dielectric 613.

In some embodiments, a workpiece can further comprise a conductive layer 661 between electrode layer 610 and upper surface 601 of the substrate 600. According to embodiments, conductive layer 661 can be formed to constitute second conductive layer 461 in beam manipulator 500 of FIG. 5 upon completion of forming the beam manipulator 500. The workpiece can further comprise an electrical insulator (not shown) between electrode portion 611 and conductive layer 661. This enables that different potential are applied to an electrode (formed from electrode portion 611) and second conductive layer (formed from conductive layer 661) in a resulting beam manipulator avoiding short circuiting. In some embodiments, conductive layer 661 may include an opening 662 positioned in an area corresponding to dielectric 613. In some embodiments, a width of the opening 662 can be smaller than or equal to a width of the dielectric 613. When the width of the opening 662 is smaller than a width of the dielectric 613, the conductive layer 661 may at least partially shield their corresponding electrodes to minimize sputtered conductive material from accumulating on electrode portions 611 at step A6. Step A6 will be further explained below.

While a method of forming a beam manipulator of FIG. 5 is explained based on a workpiece of step A1, it will be appreciated that the present disclosure can be applied to a method of forming a beam manipulator, which further includes one or more steps for manufacturing the workpiece of step A1 such as, but not limited to, cleansing a substrate, forming electrode layer 610 on substrate 600, etc.

In step A2, a first resist layer 630 is formed on second surface 602 of substrate 600. The first resist layer 630 may be a negative or positive resist. In some embodiments, first resist layer 630 may include an opening 631 corresponding to an area of the dielectric 613. Therefore, opening 631 in the first resist layer 630 can have a pattern corresponding to an intended aperture (e.g., aperture 430 of FIG. 4A). For example, opening 631 can have a shape corresponding to boundary C in FIG. 4A). The opening can have a substantially circular shape from a top view. In some embodiments where a plurality of electrodes 411 are included in a beam manipulator, the pattern of opening 631 can include not only boundary C but also the patterns corresponding to gaps (e.g., gaps 431 of FIG. 4A), for example radially extending portions periodically distributed around the periphery of the substantially circular shape. In some embodiments, first resist layer 630 can be aligned to cover the electrode portions 611 from atop view.

In step A3, substrate 600 can be etched through opening 631 in first resist layer 630. In some embodiments, hole 632 can be formed extending from first surface 601 to second surface 602 of the substrate 600. Substrate 600 may be etched by DRIE (deep reactive ion etching) allowing high aspect ratio, RIE (reactive ion etching) such as plasma etching, etc. In some embodiments, substrate 600 can be etched by, but not limited to, a Bosch Process that is a high-aspect ratio plasma etching process. According to embodiments of the present disclosure, an aperture (e.g., such as aperture 430) and any gaps (e.g., gaps 431 of FIG. 4A) can be etched simultaneously at step A3 because opening 631 of first resist layer corresponds to an area of the dielectric 613 and the dielectric 613 can have a pattern corresponding to the aperture 430 and gaps 431. In step A3, dielectric 613 may function as a stop layer for the etching process when etching the substrate 600. In some embodiments, a width of hole 632 may be wider than a width of the opening 662 in the conductive layer 661 so that a part of the conductive layer 661 around the hole 632 can be exposed by the etching process as shown at step A3 of FIG. 6.

In step A4, a second resist layer 640 can be formed on electrode layer 610. The second resist layer 640 may be a negative or positive resist. In some embodiments, second resist layer 640 can have an opening 641 corresponding to an area of the dielectric 613. In order to assure that the dielectric 613 is removed by a subsequent etching process, the opening 641 may have a wider width than a width of the dielectric 613. For example, a part of electrode portion 611 may not be covered by second resist layer 640 as shown at step A4 of FIG. 6.

In step A5, dielectric 613 can be etched through opening 641 of second resist layer 640. Dielectric 613 can be etched by a wet or dry etching (e.g., RIE etching) process while routing portion 621 is protected by second resist layer 640. In some embodiments, an etching process for removing the dielectric 613 can be performed by material that does not etch electrode portion 611 so that a part of the electrode portion 611, which is not covered by second resist layer 640, is not etched away during the etching process. By removing the dielectric 613 at step A5, a hole 633 extending from second surface 602 of substrate 600 to electrode portion 611 can be formed, which can constitute an aperture in a beam manipulator (e.g., an aperture 430 in FIG. 5). In some embodiments, at step A5, any gaps (e.g., gaps 431 of FIG. 4A) between adjacent electrodes can also be formed in electrode layer 610. Step A5 may include removing the second resist layer 640 after the dielectric 613 is removed.

In step A6, a second conductive layer 680 can be formed on a hole facing surface of substrate 600, which extends from first surface 601 to second surface 602 of the substrate 600. In some embodiments, second conductive layer 680 can be formed to constitute a first conductive layer (e.g., first conductive layer 481 in beam manipulator 500 of FIG. 5) upon completion of forming the beam manipulator. In some embodiments, second conductive layer 680 can be formed on the second surface 602 of the substrate 600. In some embodiments, second conductive layer 680 can be coated on second surface 602 of substrate 600 and a hole facing surface of substrate 600. In some embodiments, second conductive layer 680 can be coated by sputtering conductive material from a second surface side of substrate 600 as indicated as arrows at step A6 in FIG. 6. Second conductive layer 680 can also be coated by evaporation deposition process, sputtering deposition, etc. At step A6, conductive layer 661 can prevent second conductive layer 680 from contacting with electrode portion 611. In some embodiments, because conductive layer 661 is protruded into hole 633 beyond electrode portion 611, accumulation of the sputtered conductive material of the second conductive layer 680 on the electrode portion 611 can be minimized or removed, for example, by a shadowing effect. Thereby, a short circuit between second conductive layer 680 and electrode portion 611 can be prevented. In some embodiments where a beam manipulator includes one or more gaps (e.g., gap 431 of FIG. 4B) and one or more protruding portions (e.g., protruding portion 451 of FIG. 4B), second conductive layer 680 can be further formed on side surfaces of protruding portions (e.g., 451S1 and 451S2 of FIG. 4B).

As explained above, the fabricating process illustrated in FIG. 6 can be used for fabricating beam manipulator 500 of FIG. 5. It will be noted that beam manipulator 500 of FIG. 5 can be obtained by turning the workpiece at step A6 upside down.

Figure 7:
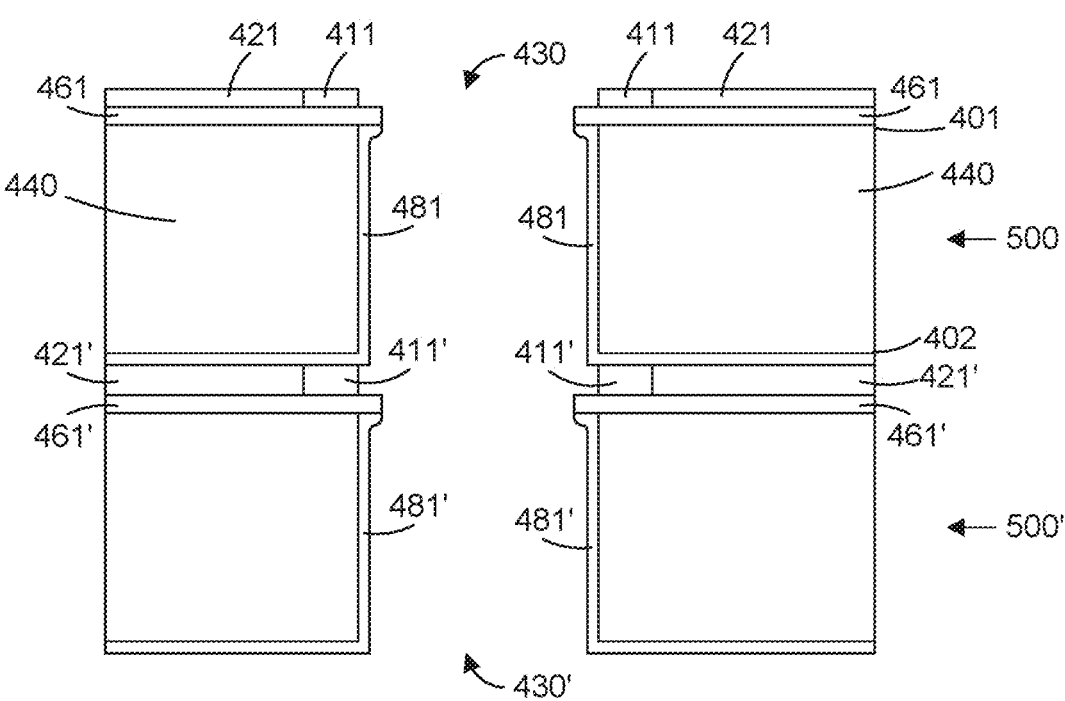
FIG. 7 is a cross section view of exemplary configurations of a stacked beam manipulating device, consistent with embodiments of the present disclosure.

FIG. 7 is a cross section view of exemplary configurations of a stacked beam manipulating device, consistent with embodiments of the present disclosure. As shown in FIG. 7, a stacked beam manipulating device 700 can be formed by placing a first beam manipulator 500 on top of a second beam manipulator 500'. In some embodiments, each of first beam manipulator 500 and second beam manipulator 500' can be beam manipulator 500 of FIG. 5. For example, second beam manipulator 500' may comprise corresponding components of the first beam manipulator, e.g., second conductive layer 461', first conductive layer 481', or aperture 430'. According to embodiments of the present disclosure, first beam manipulator 500 can be positioned on top of second beam manipulator 500' such that first conductive layer 481 coated on lower surface 402 of substrate 440 may contact with electrode 411' of second beam manipulator 500'. In some embodiments, first conductive layer 481 can function as a shielding layer. Thus, the first conductive layer 481 may provide a shielding function with respect to a down-beam manipulator, for example, the second beam manipulator 500'. Thereby, an additional shielding process or securing process (e.g., bonding/gluing) can be omitted when stacking two beam manipulators. For example, an additional shielding layer between first beam manipulator 500 and second beam manipulator 500' can be omitted when stacking first beam manipulator 500 and second beam manipulator 500'. To ensure that the conductive layer 481 and adjoining down beam electrode 411' (made of a conductive material) are isolated, an isolator layer (not shown) may be between the first beam manipulator 500 and the second beam manipulator 500'. For example, an isolator layer may be between at least the portion of the conductive layer 481 on the lower surface 402 of a first beam manipulator 500 and the down beam electrode 411'.

According to embodiments of the present disclosure, a yield rate of forming a stacked beam manipulator can be improved. According to embodiments of the present disclosure, accuracy of aligning multiple beam manipulators for a stacked beam manipulating device can be improved by combining a shield layer and a beam manipulating electrode in one element. In some embodiments, alignment error of stacking multiple beam manipulators can be decreased to order of hundreds of nanometers. When using staked beam manipulating device 700 according to embodiments of the present disclosure, beam aberration can be reduced, for example, through improved alignment of multiple beam manipulators. According to embodiments of the present disclosure, a stacked beam manipulating device can be efficiently manufactured by omitting additional shielding processes or bonding processes between adjacent beam manipulators. According to embodiments of the present disclosure, deflection strength can be increased by stacking multiple beam manipulators. While FIG. 7 illustrates that two beam manipulators 500 and 500' are stacked, it is appreciated that the present disclosure can also be applied when three or more beam manipulators are stacked to obtain a target cumulative deflection strength.

Figure 8:
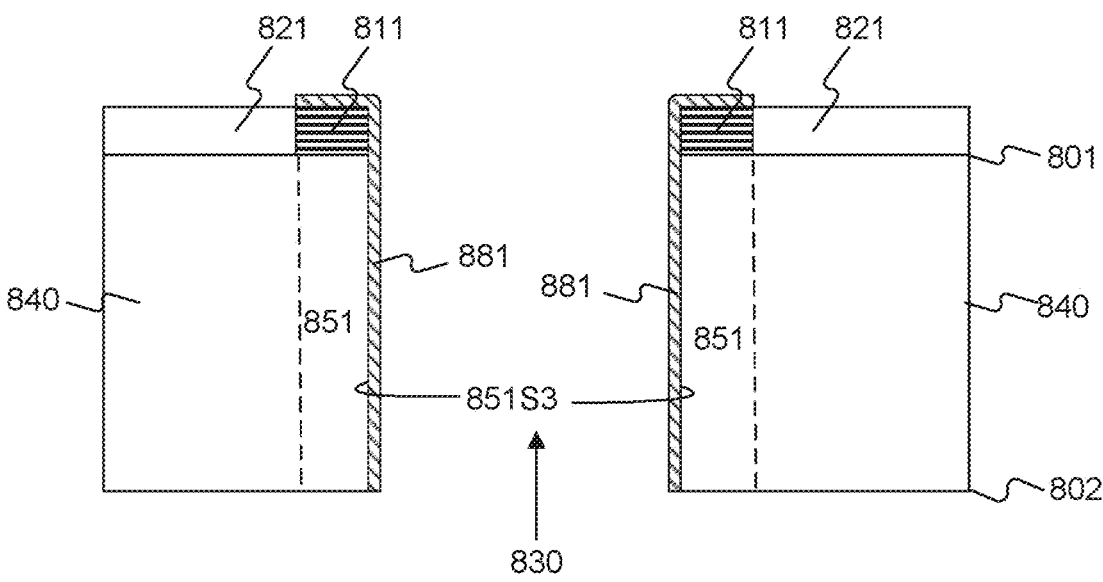
FIG. 8 is a cross section view of exemplary configurations of a beam manipulator, consistent with embodiments of the present disclosure.

Although FIG. 7 illustrates that each of beam manipulators 500 and 500' in stacked beam manipulating device 700 includes its own corresponding routing portion 421 or 421', it is appreciated that only one of the stacked beam manipulators 500 and 500' can have a routing portion and the other beam manipulator may not have its own routing portion. For example, second beam manipulator 500' may not have its own routing portion and may be wired to routing portion 421 of first beam manipulator 500. In this example, there can be an electrical connection between first electrode layer 481 of first beam manipulator 500 and electrode 411' of second beam manipulator 500'. According to embodiments, resources can be saved in manufacturing a stacked manipulating device Now reference is made to FIG. 8 illustrating a cross section view of exemplary configurations of a beam manipulator, consistent with embodiments of the present disclosure. The duplicated explanation regarding elements of a beam manipulator 800 may be omitted for simplicity. FIG. 8 may show a cross section view of a beam manipulator along an imaginary line A-A' in FIG. 4A. As shown in FIG. 8, beam manipulator 800 can have a substrate 840 having an upper surface 801 and a lower surface 802 and an aperture 830 formed therein according to embodiments of the present disclosure. Aperture 830 can extend between the upper surface 801 and the lower surface 802 of the substrate 840. In some embodiments, beam manipulator 800 may have one or more electrode contacts 811 around aperture 830 and may be positioned on upper surface 801 of substrate 840.

In some embodiments, two electrode contacts 811 shown in FIG. 8 may be electrically separated from each other. For example, the two electrode contacts 811 shown in FIG. 8 can constitute separate electrode contacts. In some embodiments, the two electrode contacts 811 shown in FIG. 8 can be part of a single electrode contact surrounding aperture 830, which may be rotationally symmetrical around a beamlet path. In some embodiments, the two electrode contacts 811 shown in FIG. 8 can function as one electrode contact by electrically connecting the two electrode contacts 811.

According to embodiments of the present disclosure, substrate 840 may have aperture facing surfaces 851S3 extending from upper surface 801 to lower surface 802 and facing aperture 830. In some embodiments, aperture facing surfaces 851S3 can be configured to provide a uniform charge distribution during operation. In some embodiments, beam manipulator 800 can be configured to provide a uniform charge distribution during operation on entire aperture facing surfaces 851S3 from upper surface 801 to lower surface 802.

In some embodiments, aperture facing surfaces 851S3 can be part of one surface forming aperture 830. In this example, beam manipulator 800 can include a single electrode contact and gaps (e.g., gaps 431 of FIG. 4B) are not formed in beam manipulator 800. In some embodiments, a plurality of gaps may be formed in beam manipulator 800 and the substrate 840 can include a plurality of protruding portions 851. Side surfaces (e.g., 451S1 and 451S2 of FIG. 4B) of the protruding portions 851 can also be configured to have even charge distribution between upper surface 801 and lower surface 802 during use, consistent with embodiments of the present disclosure. Here, the side surfaces of protruding portions 851 can have, during use, even charge distribution equal to even charge distribution of the aperture facing surfaces 851S3. According to embodiments, aperture facing surfaces 851S3 can have, during use, even charge distribution equal to charge distribution of their corresponding electrode 811. In some embodiments, during use, side surfaces (e.g., 451S1 and 451S2 of FIG. 4B) as well as aperture facing surfaces 851S3 can have even charge distribution equal to charge distribution of their corresponding electrode 811.

In some embodiments, aperture facing surface 851S3 of substrate 840 can be coated with a conductive layer 881, consistent with embodiments of the present disclosure. In some embodiments, conductive layer 881 can coat entire aperture facing surface 851S3 from upper surface 801 to lower surface 802. In some embodiments, conductive layer 881 can extend to contact with at least part of electrode 811 of beam manipulator 800. For example, conductive layer 881 can coat at least part of an aperture facing surface of corresponding electrode contact 811. In some embodiments, conductive layer 881 can coat an aperture facing surface and at least part of a top surface of corresponding electrode contact 811. As an example, FIG. 8 illustrates conductive layer 881 covering aperture facing surface 851S3 of substrate 840, an aperture facing surface of corresponding electrode contact 811, and a top surface of the corresponding electrode contact 811. According to embodiments, at least part of a base surface (e.g., base surface 471 of FIG. 4B) between two adjacent protruding portions 851 should not be covered by conductive layer 881 to enhance electrical isolation between two corresponding electrodes 811.

According to embodiments of the present disclosure, conductive layer 881 can be configured to have an electrical potential equal to an electrical potential of its corresponding electrode contact 811, respectively, during operation. In some embodiments where one or more gaps (e.g., gaps 431 of FIG. 4B) are included in a beam manipulator, conductive layer 881 covering one protruding portion can have an electrical potential equal to an electrical potential of an electrode contact associated with the one protruding portion. In some embodiments, a conductive layer 881 and its corresponding electrode contact 811 can be provided during operation with the same operating voltage. Here, conductive layer 881 can function as a beam manipulating electrode in conjunction with corresponding electrode contact 811. In some embodiments, conductive layer 881 or electrode contact 811 can be connected to a power source via electric circuit placed in the routing area 821. According to embodiments of the present disclosure, beam aberration can be reduced in that beam manipulator 800 can provide a uniform electric field through an entire aperture length.

In beam manipulator 800 of FIG. 8, substrate 840 and conductive layer 881 can form a main body of the beam manipulator 800 and electrode contact 811 can be an electrode contact of the beam manipulator 800. A main body can comprise an elongated electrode that forms the interconnecting surface between the first surface and the second surface. In various embodiments including beam manipulator (e.g., illustrated in FIG. 8), conductive layer 881 can be an elongated electrode included in the main body.

Figure 9:
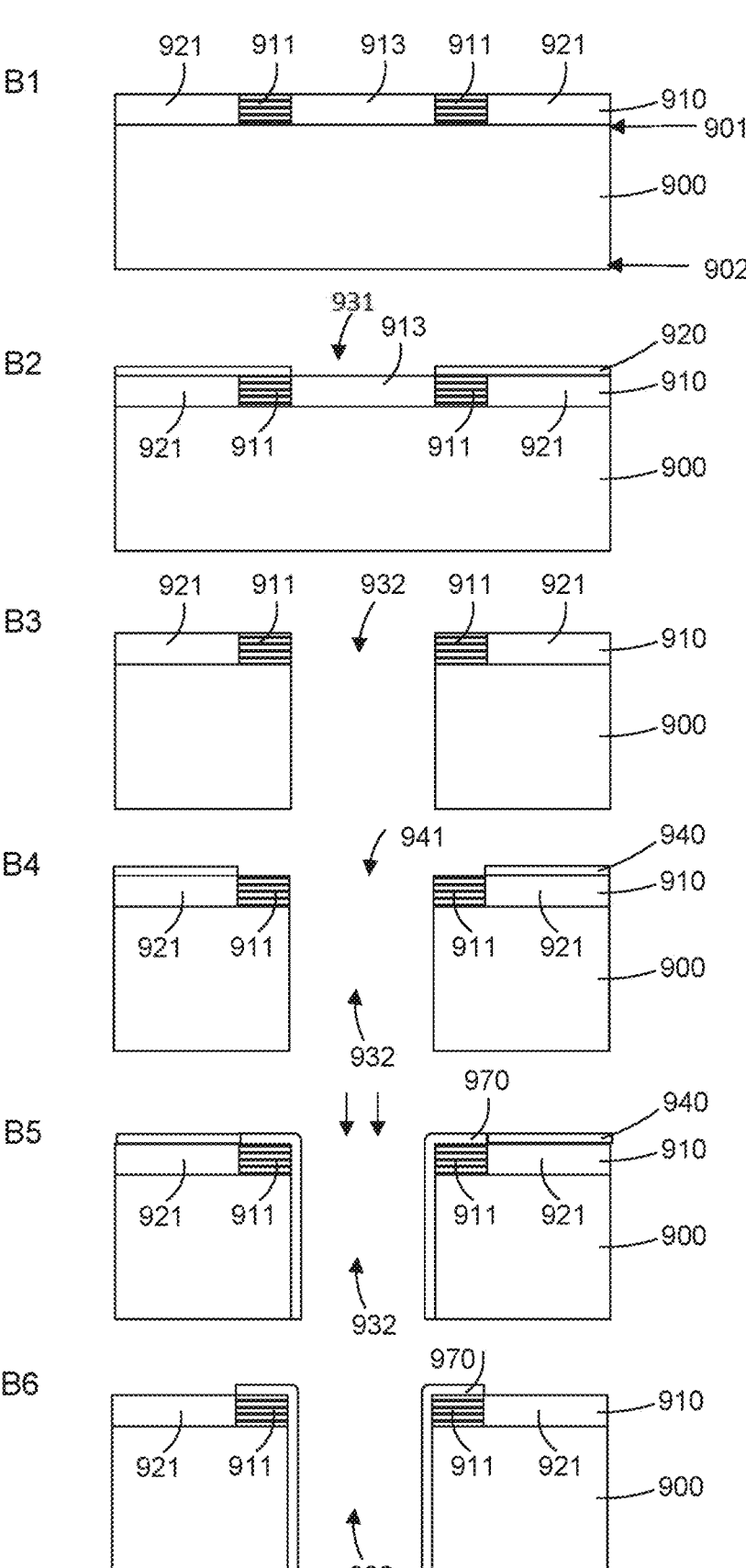
FIG. 9 illustrates an exemplary method of forming a beam manipulator of FIG. 8, consistent with embodiments of the present disclosure.

FIG. 9 illustrates an exemplary method of forming beam manipulator 800 of FIG. 8, consistent with embodiments of the present disclosure. As shown in FIG. 9, in step B1, a workpiece is provided. The workpiece can include a substrate 900 having a first surface 901 and a second surface 902 and an electrode layer 910.

Electrode layer 910 may be formed on first surface 901 of substrate 900. In some embodiments, electrode layer 910 may include electrode contact portions 911 spaced apart by a dielectric 913. According to embodiments, electrode contact portions 911 can be formed to constitute electrode contacts 811 in beam manipulator 800 of FIG. 8 upon completion of forming the beam manipulator 800. According to embodiments, dielectric 913 can have a pattern corresponding to an intended aperture (e.g., aperture 830 of FIG. 8), which can have a circular shape (e.g., boundary C) from a top view. In some embodiments where a plurality of electrodes is included in a beam manipulator, the pattern of dielectric 913 can be more spoke-shaped. For example, as shown in FIG. 4A, the spoke-shaped pattern of dielectric 913 can include not only boundary C but also the patterns, e.g., the radially outwardly extending shapes from the boundary C, corresponding to gaps 431. In some embodiments, electrode layer 910 may further include a routing portion 921. In some embodiments, routing portion 921 can be positioned adjacent to electrode contact portion 911 and outer to the electrode contact portion 911 with respect to the dielectric 913.

In step B2, a first resist layer 920 is formed on electrode layer 910. The first resist layer 920 may be a negative or positive resist According to embodiments, first resist layer 920 may include an opening 931 corresponding to an area of the dielectric 913. Therefore, opening 931 in the first resist layer 920 can have a pattern corresponding to an intended aperture (e.g., aperture 430 of FIG. 4A), which can have a circular shape (e.g., boundary C) from a top view. In some embodiments where a plurality of electrodes are included in a beam manipulator, the pattern of opening 931 can include not only boundary C, but also the patterns corresponding to gaps (e.g., gaps 431 of FIG. 4A), for example radially extending portions periodically distributed around the periphery of the substantially circular shape. In some embodiments, first resist layer 920 can be aligned to cover the electrode contact portions 911 from a top view.

In step B3, dielectric 913 and substrate 900 can be etched through the opening 931 in first resist layer 920. In some embodiments, a hole 932 can be formed extending from an upper surface to a lower surface of the workpiece. For example, hole 932 can extend from an upper surface of electrode contact 911 to second surface 902 of the substrate 900. In some embodiments, etching the substrate 900 can be performed separately from etching dielectric 913 while using first resist layer 920 as a mask. In some embodiments, substrate 900 can be etched after etching dielectric 913. In some embodiments, etching substrate 900 can be performed by using material different from material used for etching dielectric 913. Substrate 900 may be etched by DRIE (deep reactive ion etching) allowing high aspect ratio, RIE (reactive ion etching) such as plasma etching, etc. In some embodiments, substrate 900 can be etched by, but not limited to, a Bosch Process that is a high-aspect ratio plasma etching process. In step B3, first resist layer 920 may protect routing portion 921 or electrode portion 911 during the etching process. Step B3 may include removing the first resist layer 920. According to embodiments of the present disclosure, any gaps (e.g., gaps 431 of FIG. 4A) between adjacent electrodes as well as the intended aperture (e.g., aperture 430 of FIG. 4A) can be etched simultaneously at step B3 because opening 931 of first resist layer 920 corresponds to an area of the dielectric 913 and the dielectric 913 can have a pattern corresponding to the aperture and gaps. Step B3 may include removing the first resist layer 920 after the dielectric 913 and the substrate are etched.

In step B4, a second resist layer 940 can be formed on electrode layer 910. The second resist layer 940 may be a negative or positive resist. In some embodiments, second resist layer 940 can cover routing portion 921 in order to protect the routing portion 921 during a subsequent step, i.e., step B5. In some embodiments, second resist layer 940 can have an opening 941 exposing at least part of electrode portion 911. At step B4 in FIG. 9, second resist layer 940 is formed to cover routing portion 921 and to expose electrode contact portion 911.

In step B5, a conductive layer 970 can be formed on an aperture facing surface of substrate 900, which extends from first surface 901 to second surface 902 of the substrate 900. In some embodiments, conductive layer 970 can be formed to constitute conductive layer 811 in beam manipulator 800 of FIG. 8 upon completion of forming the beam manipulator 800. In some embodiments, conductive layer 970 can be formed to contact with electrode contact portion 911. In some embodiments, conductive layer 970 can be coated on a part of electrode contact portion 911 and an aperture facing surface of substrate 900. In some embodiments, conductive layer 970 can be coated by sputtering conductive material from an upper side of the workpiece as indicated as arrows at step B5 of FIG. 9. Conductive layer 970 can be also coated by evaporation deposition process, sputtering deposition, chemical vapor deposition, etc. At step B5, conductive material can be also deposited on the exposed upper surface and aperture facing surface of the electrode contact portion 911 while the aperture facing surface of the substrate 900 is coated by the deposited conductive material. In some embodiments, step B5 may further include removing deposited conductive material on a base surface (e.g., base surface 471 of FIG. 4B) after depositing conductive layer 970 to enhance electric isolation between two adjacent electrodes. In some embodiments, step B5 may further include treating the base surface to ensure that material is not deposited on the base surface before depositing a conductive layer 970. In step B6, the second resist layer 940 can be removed. When the second resist layer 940 is removed, redundant conductive material deposited in step B5 may be also removed.

As discussed above, it has been illustrated that even charge distribution through a body of a beam manipulator is implemented by coating conductive material on a non-conductive substrate. However, obtaining full conductive coating on a main body of a beam manipulator can be challenging in some scenarios:

(1) Where an aperture has a high aspect ratio. Obtaining evenly deposited conductive material on a hole facing surface of a beam manipulator is challenging with some conductive material deposition techniques such as sputtering when the hole is narrow and deep. Some other conductive material deposition techniques such as ALD (atomic layer deposition) may not be cost effective;

(2) Where a Bosch process is used for bulk etching of a silicon substrate. In this situation, scallops can be formed in the surface of the hole and this may cause shadow effects during conductive material deposition.

Therefore, the area immediately behind each scallop from the conductive material deposition direction might not be covered; and (3) Where a beam manipulator includes multiple electrodes and electrodes should be electrically separated from each other. In this case, selective deposition of conductive material on electrodes is required while keeping multiple electrodes from electrically connected by the conductive material deposition. In order to enhance electrical disconnection between multiple electrodes, masks should be used when depositing conductive material or conductive material should be selectively removed after deposition.

The disclosure below illustrates that even charge distribution through a body of a beam manipulator is implemented without coating conductive material on a substrate. In some embodiments, a conductive substrate can be used as a body of a beam manipulator. In some embodiments, a highly doped silicon substrate can be used as a conductive substrate. Doping a substrate with a higher dose can lead to higher electric conductance and enable the substrate to behave similar to a metal. For example, when a silicon substrate is doped with dopant concentration of $1e^{21}$ atoms/$cm^3$, the substrate can have resistivity of $1e^6$ Ohm*m, which indicates electric conductivity equal to or even higher than a metal.

Figure 10A:
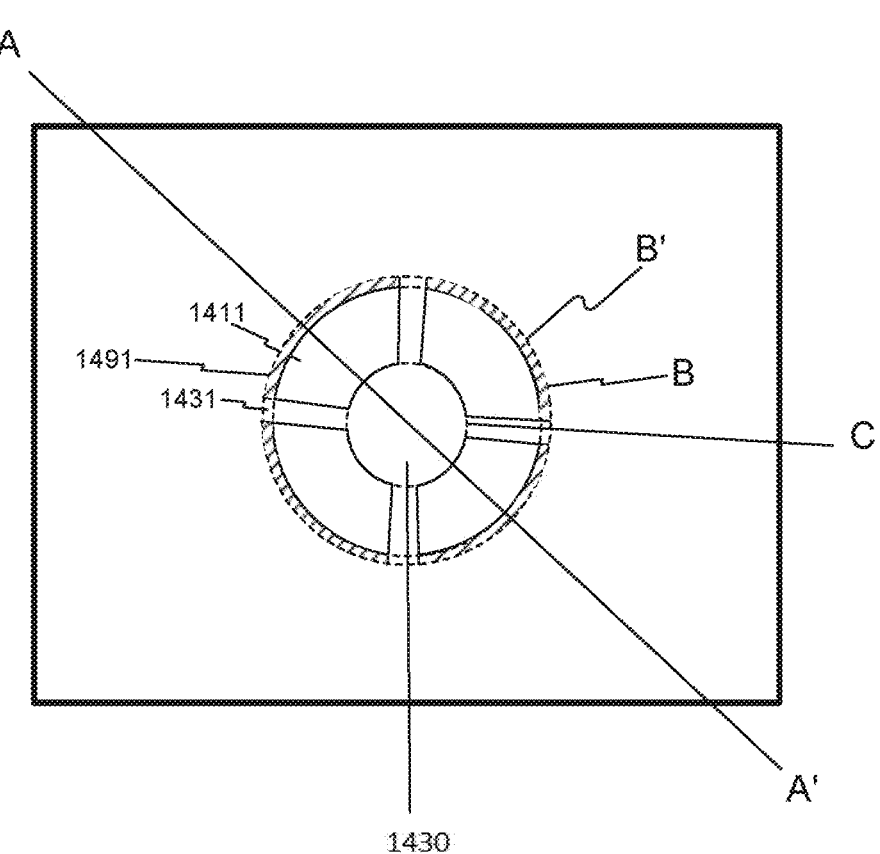
FIG. 10A is a schematic plan view of an exemplary beam manipulator formed based on a conductive substrate, consistent with embodiments of the present disclosure.
Figure 10B:
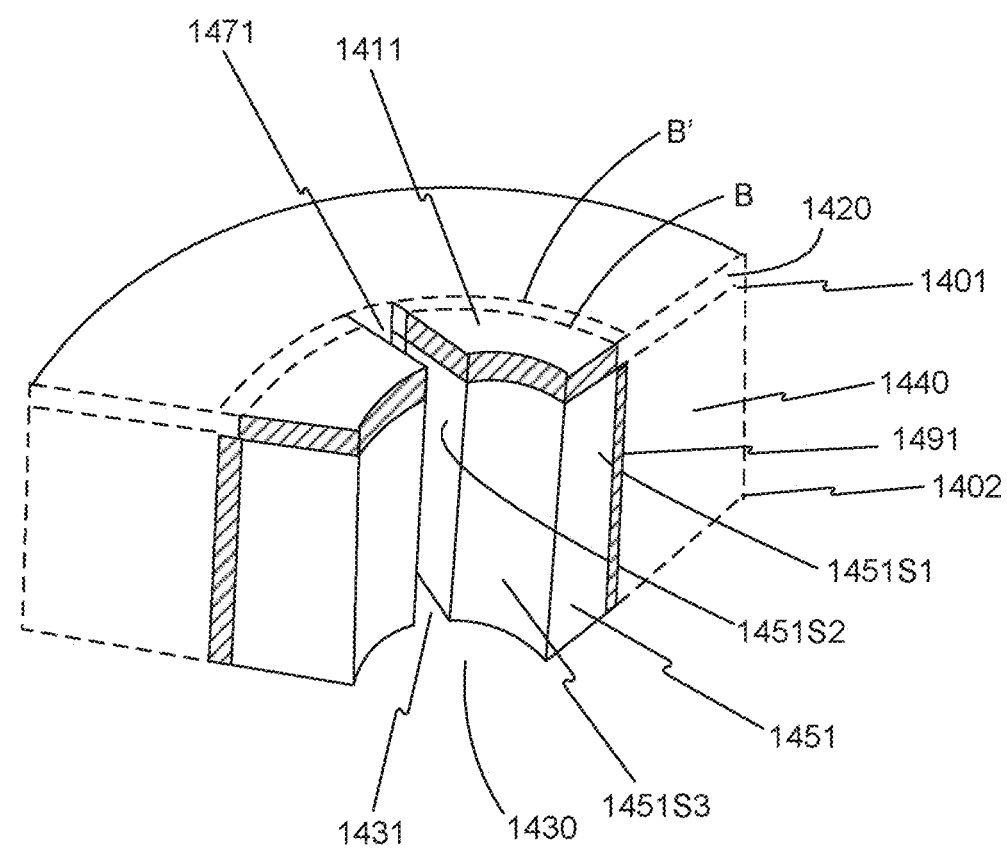
FIG. 10B is a schematic cross-sectional perspective view of the beam manipulator of FIG. 10A.

Reference is made to FIG. 10A illustrating a schematic plan view of an exemplary beam manipulator formed based on a conductive substrate, consistent with embodiments of the present disclosure. FIG. 10B is a schematic cross-sectional perspective view of the beam manipulator of FIG. 10A. As shown in FIG. 10B, a beam manipulator 1000 may include a substrate 1440 and one or more electrodes 1411. An aperture 1430 extending through two opposing surfaces of substrate 1440 is formed in the substrate 1440. The two opposing surfaces of substrate 1440 can constitute major surfaces of substrate 1440. The two opposing surfaces may include an upper surface 1401 and a lower surface 1402 of the substrate 1440.

In some embodiments, one or more electrodes 1411 can be formed around aperture 1430 as shown in plan view in FIG. 10A. In some embodiments, aperture 1430 can have a substantially circular shape (e.g., boundary C). The one or more electrodes 1411 extend radially outwardly from the aperture 1430. For example, one or more electrodes 1411 can be positioned adjacent to aperture 1430 and can be positioned in upper surface 1401 of substrate 1440. For example, each aperture facing surface of one or more electrodes 1411 can form a part of aperture 1430. In FIG. 10A, the aperture facing surface of the electrode 1411 is shown as a part of a rim defining the aperture 1430 in the upper surface of the substrate. In some embodiments, the one or more electrodes 1411 form a portion of upper surface 1401. For example, the one or more electrodes 1411 may be positioned between aperture 1430 and a certain boundary (such as boundary B). In some embodiments, the certain boundary may surround the aperture 1430. The certain boundary may be circular and the aperture 1430 substantially surrounded by the circular boundary may be substantially circular.

In various embodiments where beam manipulator 1000 has a plurality of electrodes, such as four electrodes as shown in FIG. 10A, two adjacent electrodes among the plurality of electrodes 1411 may be spaced apart. Mutually facing surfaces of two adjacent electrodes may define a gap therebetween. For example, two facing surfaces of two adjacent electrodes 1411 may be spaced apart by a gap 1431.

In some embodiments, the facing surfaces defining gap 1431 may be parallel as shown in FIG. 10A. In some other embodiments, the facing surfaces defining gap 1431 may radially diverging. The gap 1431 may have a consistent tangential dimension along its radial length. Here, a radial length of electrode 1411 can correspond to a radial distance between boundary B to boundary C. In some embodiments, a gap (such as gap 1431) can have a radial length longer than a radial length of electrode 1411 to enhance electric disconnection between two adjacent electrodes 1411. For example, a radial length of gap 1431 can correspond to a radial distance between a boundary B' to boundary C. It will be noted that boundaries B, B', and C are assumed to be continuous in that the gaps 1431 do interfere or even disrupt the boundaries B, B', and C.

In some embodiments, gap 1431 can extend through substrate 1440 between upper surface 1401 and lower surface 1402 as shown in FIG. 10B. Gap 1431 can extend through an entire length of the beam manipulator 1000. Resulting from gap 1431 formed in substrate 1440, substrate 1440 can have one or more protruding portions 1451. Each of protruding portions 1451 comprises its respective electrode 1411, such that the electrode portion 1411 provides at least one surface of the protruding portion 1451, in plan view, radially inwardly protruding, for example, from boundary line B'. Each of the one or more protruding portions 1451 has two or more side surfaces facing gaps adjacent to the corresponding protruding portion. For example, protruding portion 1451 can have a first side surface 1451S1 and a second side surface 1451S2 that face opposite sides respectively. In some embodiments, a base surface 1471 can extend from an upper surface of beam manipulator 400 to lower surface 402 of substrate 440. Base surface 1471 can be positioned radially outside of boundary B from the aperture 1430 or at boundary B. In some embodiments, protruding portions 1451 have aperture facing surfaces 1451S3, each of which meets with first side surface 1451S1 and with second side surface 1451S2. In some embodiments, each of the protruding portions 1451 extends from the upper surface 1401 to the lower surface 402 of the substrate 440.

According to embodiments of the present disclosure, while beam manipulator 1000 is shown as having four electrodes 1411 in FIG. 10A and FIG. 10B, it is appreciated that beam manipulator 1000 can have any number of electrodes, for example, eight electrodes, ten electrodes, twelve electrode, and so on. In some embodiments. In some embodiments, beam manipulator can have a single electrode. A single electrode may have an annular, preferably ring, shaped surrounding aperture 1430. In some embodiments, beam manipulator 1000 may not include a gap and aperture 1430 can be formed along boundary C and can extend from an upper surface of beam manipulator 1000 to lower surface 402 of substrate 1440. In some other embodiments, beam manipulator 1400 may include a gap (e.g., gap 1431) separating two ends of the same electrode.

According to embodiments, beam manipulator 1000 can further include an isolation layer 1491 in substrate 1440 such that each of protruding portions 1451 is electrically isolated from the rest of the substrate 1440 or the rest of the protruding portions. As shown in FIG. 10B, each of protruding portions 1451 can include isolation layer 1491 extending from upper surface 1401 to lower surface 1402 of substrate 1440 and can be positioned between boundary B and boundary B'. In some embodiments, a radial length of gap 1431 can correspond to a radial length of electrode 1411, which corresponds to a radial distance between boundary B to boundary C. In this example, isolation layer 1491 can be positioned radially outwardly from electrode 1411. Isolation layer 1491 may have an annular, preferably ring, shape whose radial length corresponds to a radial distance between boundary B and boundary B'. In some embodiments, isolation layer 1491 can be made of electric insulation material. For example, oxide material can be used for forming isolation layer 1491.

According to embodiments of the present disclosure, one or more beams can be manipulated by electric fields generated by beam manipulator 1000. To generate electric fields to affect trajectories of one or more beams passing through aperture 1430, one or more electrodes 1411 can be electrically connected via routing individually or collectively to a corresponding power source. The power source is generally positioned outside of an electron column of SEM. In some embodiments, an electric circuit configured to provide a driving voltage or control signal to one or more electrodes 1411 can be formed on the rest portion 1420 of the upper surface 1401 of substrate 1440.

When a conductive substrate is used as a body of beam manipulator 1000, for example, as illustrated in FIG. 10A and FIG. 10B, an additional conductive coating layer is not necessary to make aperture facing surface 1451S3 of the substrate 1440 conductive in that protruding portion 1451 of the substrate 1440 itself is conductive. Such a conductive protruding portion 1451 may form a constituent part of an elongate electrode. According to some embodiments of the present disclosure, a conductive coating layer can be applied to beam manipulator 1000 formed based on a conductive substrate. For example, when even higher conductance or more uniform charge distribution is required, conductive material can be coated on at least part of a conductive substrate. In these embodiments, defects (e.g., nonuniform deposition) of conductive material coating may have less impact on beam manipulation in that a substrate surface under the conductive coating material is also conductive.

Figure 11A:
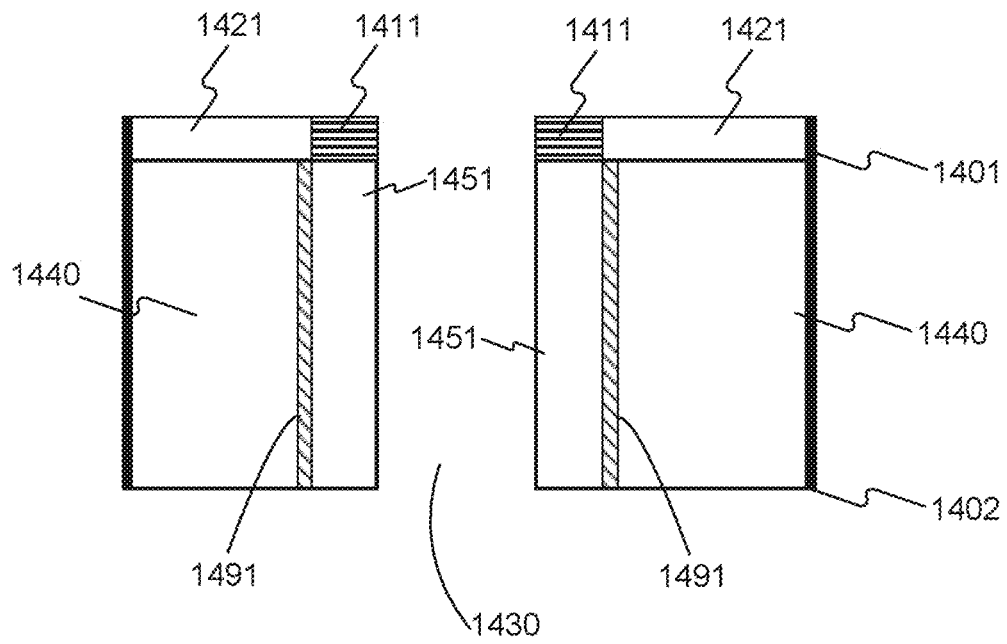
FIG. 11A is a cross section view of exemplary configurations of a beam manipulator based on a conductive substrate, consistent with embodiments of the present disclosure.

Now reference is made to FIG. 11A illustrating a cross sectional view of exemplary configurations of a beam manipulator 1100 based on a highly doped silicon substrate 1440, consistent with embodiments of the present disclosure. FIG. 11A may show a cross sectional view of a beam manipulator along an imaginary line A-A' in FIG. 10A. As shown in FIG. 11A, beam manipulator 1100 can have substrate 1440 having upper surface 1401 and lower surface 1402 and aperture 1430 formed therein according to embodiments of the present disclosure. Aperture 1430 can extend between the upper surface 1401 and the lower surface 1402 of the substrate 1440. In some embodiments, beam manipulator 1100 may have one or more electrodes 1411 around aperture 1430 and may be positioned on upper surface 1401 of substrate 1440.

In some embodiments, two electrodes 1411 shown in FIG. 11A may be electrically separated from each other. For example, the two electrodes 1411 can constitute separate electrodes. In some embodiments, two electrodes 1411 shown in FIG. 11A can be part of a single electrode surrounding aperture 1430. In some other embodiments, two electrodes 1411 shown in FIG. 11A can function as one electrode by electrically connecting the two electrodes 1411.

As discussed with respect to FIG. 10A and FIG. 10B, beam manipulator 1100 can further comprise isolation layer 1491 formed in substrate 1440. As shown in FIG. 11A, isolation layer 1491 extends from upper surface 1401 to lower surface 1402 of substrate 1440 such that its corresponding protruding portion 1451, i.e., elongated electrode, is electrically separated from a rest of the substrate 1440.

In some embodiments, beam manipulator 1100 can further comprise a routing portion 1421. For example, routing portion 1421 can be positioned on upper surface 1401 of substrate 1440 and adjacent to electrode 1411. In some embodiments, protruding portion 1451 of substrate 1440 can have an electric potential different from corresponding electrode 1411 while operating. For example, protruding portion 1451 can be provided with a ground voltage. Here, the protruding portion 1451 can function as a shielding layer or shielding electrode. In some embodiments, each of protruding portions 1451 or 1455 can be provided with the same electric potential, which is different from an electric potential of corresponding electrode 1411. In some embodiments, protruding portion 1451 can be connected to a power source via electric circuit placed in the routing portion 1421.

In beam manipulator 1100 of FIG. 11A, substrate 1440 can form a main body of the beam manipulator 1100 and electrode 1411 can be at least part of an electrode of the beam manipulator 1100. A main body can have a first surface and a second surface opposing to the first surface and an interconnecting surface extending between the first surface and the second surface and forming an aperture through the body according to embodiments of the present disclosure. A main body can comprise an elongated electrode that forms the interconnecting surface between the first surface and the second surface. In various embodiments including a beam manipulator (e.g., illustrated in FIG. 11A), a protruding portion 1451 of a highly doped silicon substrate 1440 can be an elongated electrode included in the main body.

Figure 11B:
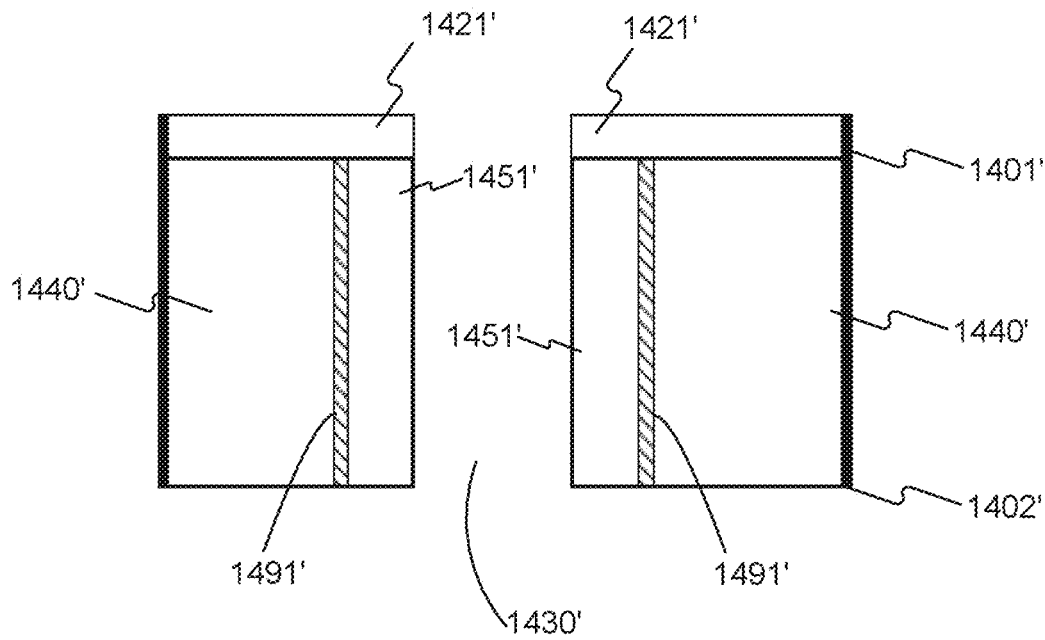
FIG. 11B is a cross section view of exemplary configurations of another beam manipulator based on a conductive substrate, consistent with embodiments of the present disclosure.

FIG. 11B is a cross section view of another exemplary configurations of a beam manipulator 1100' based on a highly doped silicon substrate, consistent with embodiments of the present disclosure. Beam manipulator 1100' has a similar configuration with beam manipulator 1100 shown in FIG. 11A (for example, beam manipulator 1100' may comprise lower surface 1402' and aperture 1430') except that beam manipulator 1100' does not comprise electrode 1411. Instead, in beam manipulator 1100' shown in a FIG. 11B, protruding portion 1451' (of substrate 1440') can function as an electrode. That is, protruding portion 1451' may function as an electrode because substrate 1440' is conductive. In some embodiments, a routing portion 1421' can be located on an upper surface 1401' of substrate 1440'. For example, routing portion 1421' can cover both of corresponding protruding portion 1451' and the rest of the substrate 1440'. In beam manipulator 1100', one or more protruding portions 1451' can function as electrodes of a beam manipulator and thus each of the protruding portions 1451' can be provided with its corresponding operating voltage. As discussed with respect to FIG. 11A, each of the protruding portions 1451' can be electrically isolated from the rest of the protruding portions via isolation layer 1491'.

Figure 12:
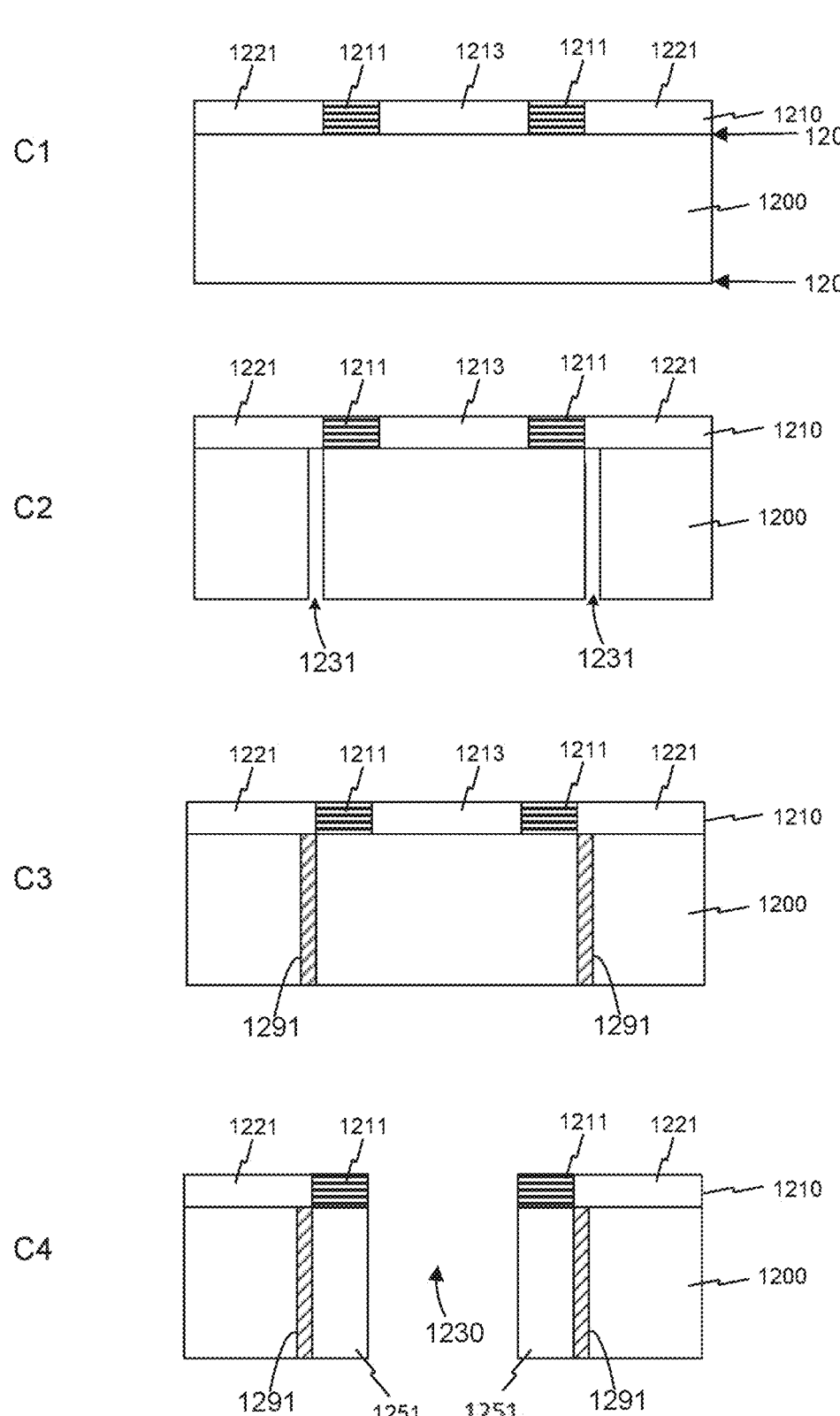
FIG. 12 illustrates an exemplary method of forming a beam manipulator of FIG. 11A or FIG. 11B, consistent with embodiments of the present disclosure.

FIG. 12 illustrates an exemplary method of forming beam manipulator 1100 of FIG. 11A, consistent with embodiments of the present disclosure. While a method of forming beam manipulator 1100 of FIG. 11A will be explained, it will be appreciated that the present disclosure can be used for forming beam manipulator 1100' of FIG. 11B (for example, including protruding portion 1251 and isolation layer 1291) except that an electrode layer 1210 does not include an electrode portion 1211.

As shown in FIG. 12, in step C1, a workpiece is provided. The workpiece can include a substrate 1200 and electrode layer 1210. Electrode layer 1210 may be formed on an upper surface 1201 of the substrate 1200. Substrate 1200 can be a highly doped silicon substrate. In some embodiments, electrode layer 1210 may include electrode portions 1211 spaced apart by a dielectric 1213. According to embodiments, electrode portions 1211 can be formed to constitute electrodes 1411 in beam manipulator 1100 of FIG. 11A upon completion of forming the beam manipulator. According to embodiments, dielectric 1213 can have a pattern corresponding to an intended aperture (e.g., aperture 1430 of FIG. 10A), which can have a substantially circular shape (e.g., boundary C) from a top view. In some embodiments where a plurality of electrodes 1411 are included in a beam manipulator, the pattern of dielectric 1213 can be more spoke-shaped. For example, as shown in FIG. 10A, the spoke-shaped pattern of dielectric 1213 can include not only a substantially boundary C but also the patterns, e.g., the radially outwardly extending shapes from the boundary C, corresponding to gaps 1431.

In some embodiments, electrode layer 1210 may further include a routing portion 1221. In some embodiments, routing portion 1221 can be positioned adjacent to electrode portion 1211 and outer to the electrode portion 1211 with respect to the dielectric 1213. For beam manipulator 1100' of FIG. 11B, electrode portion 1211 can be replaced by routing portion 1221.

In step C2, substrate 1200 can be etched. In some embodiments, a trench 1231 can be formed extending from lower surface 1202 to upper surface 1201 of substrate 1200. Trench 1231 can be formed by, but not limited to, a Bosch Process. In some embodiments, trench 1231 can be part of an annularly, e.g., ring, shaped trench (e.g., between boundary B and boundary B' of FIG. 10A.). In some embodiments, step C2 may further include forming a mask (not shown) having a pattern of the trench 1231 on lower surface 1202 of substrate 1200 before etching the substrate 1200. Step C2 may further include removing the mask after etching the substrate 1200. In some embodiments, etching can be performed from a lower surface side of substrate 1200. Here, electrode layer 1210 can function as a stopping layer when etching the substrate 1200.

In step C3, trench 1231 can be filled with electrical insulation material. In some embodiments, oxide material can be filled in the trench 1231. Oxide material can be silicon oxide that is compatible with subsequent steps. In some embodiments, trench 1231 can be filled by a deposition process such as, but not limited to, CVD (chemical vapor deposition), PECVD (plasma-enhanced chemical vapor deposition), etc. Filling trench 1231 can be performed from a lower surface side of substrate 1200. Step C3 may further include removing insulation material deposited other than trench 1231.

In step C4, dielectric 1213 and substrate 1200 can be etched so that a hole 1230 can be formed extending from an upper surface to a lower surface of the workpiece. Dielectric 1213 can be etched by a wet or dry etching process. Substrate 1200 may be etched by DRIE (deep reactive ion etching), RIE (reactive ion etching) such as plasma etching, etc. For example, hole 1230 can extend from an upper surface of electrode portion 1211 to lower surface 1202 of the substrate 1200. According to embodiments of the present disclosure, any gaps (e.g., gaps 1431 of FIG. 10A) between adjacent electrodes as well as the intended aperture (e.g., aperture 1430 of FIG. 10A) can be etched simultaneously at step C4. In some embodiments, etching the substrate 1200 can be performed separately from etching dielectric 1213. In some embodiments, substrate 1200 can be etched after etching dielectric 1213. In some embodiments, etching substrate 1200 can be performed by using material different from material used for etching dielectric 1213. In some embodiments, substrate 1200 can be etched by, but not limited to, a Bosch Process that is a high-aspect ratio plasma etching process. While a resist layer is not shown in FIG. 12, step C4 can be performed after forming a resist layer (e.g., first resist layer 920 in FIG. 9) having an opening corresponding to an area of dielectric 1213. In some embodiments, the resist layer can be aligned to cover the electrode portion 1211 from a top view. The resist layer may be formed in any time during steps C1 to C3 and before step C4. The resist layer can comprise a first mask layer (e.g., of oxide material) and a second mask layer (e.g., silicon material). The first mask layer can be used to protect electrode layer 1210 during etching of dielectric 1213 and the second mask layer can be used to protect electrode layer 1210 during etching of substrate 1200. In some embodiments, step C4 may further include removing the resist layer after etching dielectric 1213 and substrate 1200.

Figure 13:
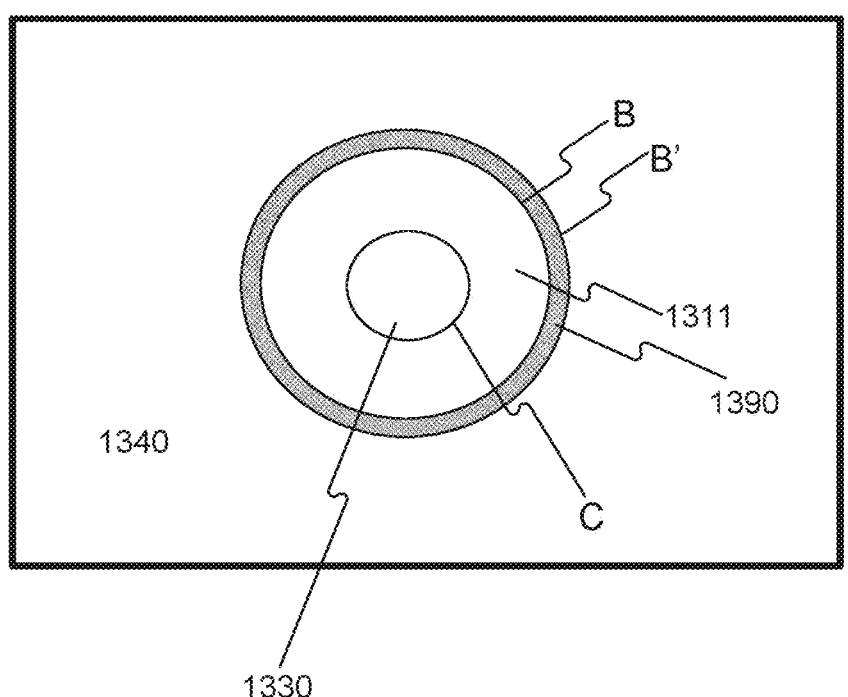
FIG. 13 a schematic plan view of an exemplary beam manipulator based on a conductive substrate and having single electrode, consistent with embodiments of the present disclosure.

FIG. 13 a schematic plan view of an exemplary beam manipulator based on a doped silicon substrate and having a single electrode, consistent with embodiments of the present disclosure. As shown in FIG. 13, a beam manipulator 1300 includes a single electrode 1311 that is electrically separated from the rest of the substrate 1340 by an isolation layer 1390. In this example, the inner part inside boundary B of the substrate 1340 may function as an electrode and therefore additional electrode may not be included. Here, substrate 1340 can be a conductive substrate. In some embodiments, beam manipulator 1300 can correspond to beam manipulator 1000, 1100 or 1100' shown in FIGS. 10A, 10B, 11A, and 11B except that beam manipulator 1300 does not include a gap and beam manipulator 1300 include a single electrode.

Figure 14:
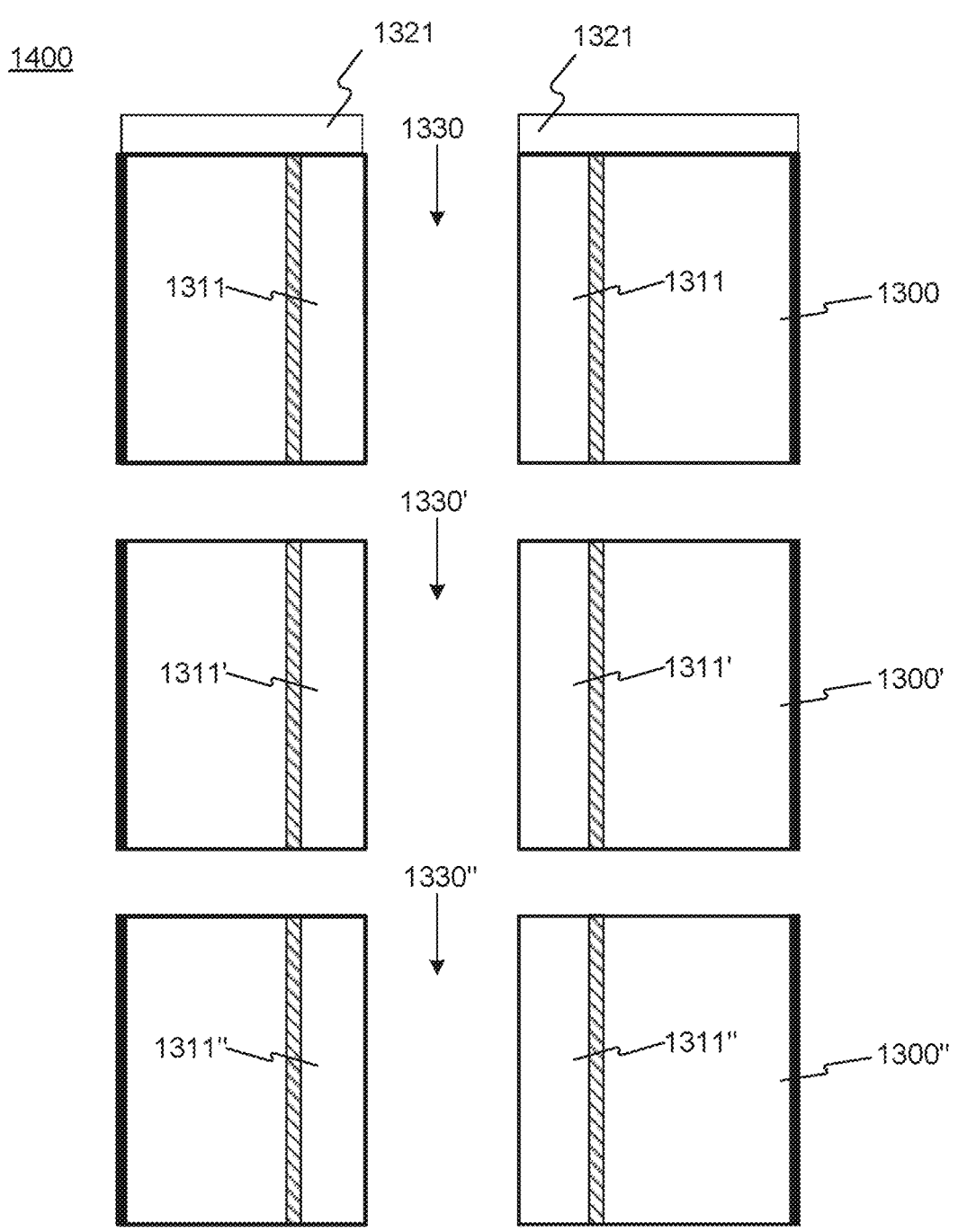
FIG. 14 is a cross section view of a stacked beam manipulating device, consistent with embodiments of the present disclosure.

FIG. 14 is a cross section view of a lens formed by a beam manipulator of FIG. 13. In FIG. 14, one or more elements including a routing layer are omitted for simplicity. In FIG. 14, a stacked beam manipulating device 1400 can comprise a first beam manipulator 1300, a second beam manipulator 1300', and a third beam manipulator 1300", each of which can be beam manipulator 1300 of FIG. 13. A cross sectional view of beam manipulator 1300 in FIG. 13 is illustrated for each of first beam manipulator 1300, second beam manipulator 1300', and third beam manipulator 1300" in FIG. 14. In FIG. 14, first beam manipulator 1300 can be positioned on top of second beam manipulator 1300' that is positioned on top of third beam manipulator 1300". In some embodiments, stacked beam manipulator 1400 can function as a lens such as an einzel lens by applying proper electric potentials to each of beam manipulators 1300, 1300', and 1300". For example, a common potential, such as ground voltage, can be applied to first electrode 1311 of first beam manipulator 1300 and third electrode 1311" of third beam manipulator 1300". A different voltage (e.g., positive voltage) can be applied to second electrode 1311' of second beam manipulator 1300'. The electrodes 1311, 1311', and 1311" may define a respective through hole 1330, 1330', and 1330" through the substrate of each manipulator 1300, 1300', and 1300". In this example, an electric field is formed in a vertical direction in FIG. 14, which is perpendicular to a plane parallel to a substrate surface while ant horizontal electric field can be formed in a beam manipulator having multiple electrodes (e.g., beam manipulator in FIG. 10A and FIG. 10B). In this arrangement, the beam energy entering the first beam manipulator of the einzel lens and the beam energy leaving the third beam manipulator is the same. In another arrangement, that need not be the case, which may be achieved by having different potentials applied to the first and third manipulators or differing the geometries of the first and third manipulators (e.g., the diameters of the apertures in the first and third manipulators and/or the length of the first and third beam manipulators along the beam path). Further, although three manipulators are mentioned, any number of multiple beam manipulators may be used in the lens, such as two or more manipulators. According to embodiments of the present disclosure, beam energy (e.g., beam speed) of a beam passing through apertures 1330, 1330' and 1330" as well as its angular direction relative to the multi-beam path direction can be manipulated.

In some embodiments, stacked beam manipulator 1400 can further include an insulation layer between first beam manipulator 1300 and second beam manipulator 1300' or between second beam manipulator 1300' and third beam manipulator 1300". In some embodiments, stacked beam manipulator 1400 may have a routing portion including circuits to provide electric power to first to third beam manipulators 1300 to 1300". In some embodiments, the routing portion can be provided with respect to first beam manipulator 1300. For example, the routing portion 1321 can be positioned on top of substrate of first beam manipulator 1300 and second beam manipulator 1300' and third beam manipulator 1300" may not have their own routing portion with respect to them as shown in FIG. 14. Such an arrangement may be beneficially applied to a deflector embodiment of FIG. 14. In a deflector embodiment, the electrodes 1311, 1311', and 1311" may be a plurality of electrodes around the respective through hole 1330, 1330', and 1330", e.g., as shown in FIGS. 4A and 4B. In such an embodiment, a manipulator is provided with a routing portion to control more than one of the manipulators, e.g., at least one adjoining manipulator. A manipulator (e.g., 1300') without a routing portion may be at least in electrical contact with an adjoining manipulator (e.g., 1300) with a routing portion (e.g., 1321) or under control of a routing portion (e.g., 1321) associated with a manipulator (e.g., 1300) in electrical contact with the manipulator (e.g., 1300') without a routing portion. Adjoining manipulators (e.g., 1300 and 1300') may abut each other and may be in direct contact with each other, e.g., without an isolation layer between the electrodes 1311 and 1311' of the manipulators 1300 and 1300'. Electrically contacting the electrodes (e.g., 1311 and 1311') of adjoining deflector manipulators (e.g., 1300 and 1300') enables a deflector manipulator with electrodes even longer than the thickness of the substrate body. For such a manipulator with a deflecting function: a greater deflection may be achieved at the same operating voltage of a manipulator of a single substrate thickness; same deflection can be achieved with a lower voltage than an operating voltage of a manipulator having a single substrate thickness; or a combination of both variations. At a lower operating voltage, the options available for controlling the electrodes are greater and the routing can be denser than at higher voltages. A lensing manipulator may have an extended electrode made from multiple adjoining substrates. For the lensing manipulator to have a lensing function, the lensing manipulator may require at least another beam manipulator with a routing portion; thereby providing two separate electrodes along the beam path.

While FIG. 13 and FIG. 14 are explained with a beam manipulator based on a doped silicon substrate as an exemplary usage of a beam manipulator with single electrode, it will be appreciated that a beam manipulator formed on a non-conductive substrate can be also used similarly as illustrated in FIG. 13 and FIG. 14.

A non-transitory computer readable medium may be provided that stores instructions for a processor of a controller (e.g., controller 50 of FIG. 1) to control voltage levels, voltage polarities, voltage application timing, etc. for each electrode of the aforementioned beam manipulators. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The following clauses provided embodiments of the invention.

Clause 1: An electron beam manipulator for manipulating an electron beam in an electron projection system, the electron beam manipulator comprising: a body having a first surface and a second surface opposing to the first surface and an interconnecting surface extending between the first surface and the second surface and forming an aperture through the body, wherein the body comprises an electrode forming at least part of the interconnecting surface between the first surface and the second surface. Preferably the electrode extends between the first and second surfaces.

Clause 2: The electron beam manipulator of clause 1, wherein at least part of the electrode is associated with the aperture and is positioned on the first surface.

Clause 3: The electron beam manipulator of clause 2, wherein the electrode further forms at least part of the second surface.

Clause 4: The electron beam manipulator of clause 2 or 3, wherein the at least part of the electrode is configured to have an electric potential different from an electric potential of at least other part of the electrode when operating.

Clause 5: The electron beam manipulator of any of clauses 2 to 4, wherein the at least part of the electrode is configured to have a uniform electric potential on the interconnecting surface between the first surface and the second surface when operating.

Clause 6: The electron beam manipulator of any preceding clause, wherein the body comprises: a substrate; and a first electric conductive layer formed on one surface of the substrate and forming at least part of the first surface of the body, wherein the electrode is connected with the first electric conductive layer.

Clause 7: The electron beam manipulator of clauses 2 to 5, wherein the body comprises: a substrate; and an electrode contact formed on the substrate, wherein the electrode contact is connected with the electrode.

Clause 8: The electron beam manipulator of any of clauses 2 to 7, wherein the electrode includes multiple electrodes.

Clause 9: The electron beam manipulator of clause 8, wherein two adjacent facing surfaces of adjacent electrodes of the multiple electrodes define a gap.

Clause 10: The electron beam manipulator of clauses 7 to 9, wherein the electrode includes multiple electrodes isolated from each other.

Clause 11: The electron beam manipulator of any preceding clause, wherein the body is formed by a doped silicon substrate forming the first surface, the second surface, and the electric conductor.

Clause 12: The electron beam manipulator of clause 11, wherein the body further includes an isolation layer extending between the first surface and the second surface and electrically isolating the electrode of the doped silicon substrate from the rest of the doped silicon substrate.

Clause 13: The electron beam manipulator of clause 12, wherein the isolation layer is formed by oxide material.

Clause 14: An electron beam manipulator device for manipulating an electron beam in an electron projection system, the electron beam manipulating device comprising: a first manipulator and a second manipulator, each of the first manipulator and the second manipulator comprising: a body having a first surface and a second surface opposing to the first surface and an interconnecting surface extending between the first surface and the second surface and forming an aperture through the body, wherein the body comprises an electrode forming at least part of the interconnecting surface between the first surface and the second surface, wherein at least part of the electrode is associated with the aperture and is positioned on the first surface, and wherein the first manipulator is positioned upstream of the second manipulator in a direction of the electron beam during operation.

Clause 15: The electron beam manipulator device of clause 14, wherein the electrode further forms at least part of the second surface of the first manipulator.

Clause 16: A method for manufacturing an electron beam manipulator, the method comprising: providing a workpiece comprising a substrate having a first surface and a second surface and an electrode layer formed relative to the first surface, the electrode layer having an electrode portion; forming a resist mask having an opening corresponding to a pattern on the workpiece, leaving an unmasked portion of the substrate; etching the unmasked portion of the substrate such that an inner wall is formed through the substrate to extend between the first surface and the second surface; removing the resist mask; and forming a first conductive layer coating the inner wall of the substrate.

Clause 17: The method of clause 16, further comprising etching the electrode layer such that the electrode portion includes multiple electrode portions, wherein adjacent electrode portions of the multiple electrode portions are separated via a gap formed by the etching.

Clause 18: The method of clause 16 or 17, wherein etching the substrate is performed by using the electrode layer as a stopper.

Clause 19: The method of clause 18, further comprising: forming a routing resist mask covering a routing portion formed within the electrode layer; etching the dielectric material; and removing the routing resist mask.

Clause 20: The method of any one of clauses 16-19, wherein the resist mask is removed from the second surface and wherein forming a first conductive layer comprises: forming the first conductive layer covering the inner wall and the second surface by depositing electric conductive material from a side of the second surface.

Clause 21: The method of any one of clauses 16-20, wherein the workpiece further comprises a second conductive layer positioned between the electrode layer and the first surface and having a corresponding pattern to the pattern, and wherein forming the first conductive layer is performed to connect the first conductive layer with the second conductive layer.

Clause 22: The method of clause 16 or 17, wherein forming a resist mask is performed to form the resist mask on the electrode layer.

Clause 23: The method of clause 22, further comprising etching dielectric material filling the pattern in the electrode layer before etching the substrate.

Clause 24: The method of any one of clauses 16, 17, 22, or 23, further comprising: forming a routing resist mask covering a routing portion formed within the electrode layer before forming the first conductive layer; and removing the routing resist mask after forming the first conductive layer.

Clause 25: The method of any one of clauses 22-24, wherein forming the first conductive layer comprising: forming the first conductive layer covering the inner wall of the substrate and the electrode portion by depositing electric conductive material from a side of the first surface.

Clause 26: The method of clause 17, wherein forming the first conductive layer comprising: forming the first conductive layer to include a first part corresponding to a first electrode portion of the multiple electrode portions and a second part corresponding to a second electrode portion of the multiple electrode portions.

Clause 27: A method for manufacturing an electron beam manipulator, the method comprising: providing a workpiece comprising a conductive substrate having a first surface and a second surface; forming an isolation layer extending between the first surface and the second surface and electrically isolating a first substrate portion from a second substrate portion, the first substrate portion being positioned radially inward from the second substrate portion; and etching a part of the first substrate portion such that an inner wall extends through the substrate between the first surface and the second surface, the inner wall providing at least an electrode surface.

Clause 28: The method of clause 27, wherein forming an isolation layer includes: etching the substrate and filling the etched portion with oxide material.

Clause 29: The method of clause 27 or 28, wherein etching the first substrate portion further includes etching the first substrate portion such that gaps extend outward from the inner wall, electrode surfaces at least in part defining the facing surfaces of the gaps.

Clause 30: The method of any one of clauses 26-29, further comprising etching an electrode layer comprised in the workpiece such that an electrode layer includes multiple electrode portions, wherein adjacent electrode portions of the multiple electrode portions are separated via a gap formed by the etching.

Clause 31: An electron beam manipulator configured to manipulate an electron beam in a projection system of an electron beam tool, the charged particle beam manipulator comprising:
a substrate having opposing major surfaces and through opening providing an interconnecting surface extending between the major surfaces, wherein at least part of the interconnecting surface is defined by one or more electrodes.

Clause 32: The electron beam manipulator of clause 31, wherein the one or more electrodes comprise metal.

Clause 33: The electron beam manipulator of clause 31 or 32, wherein the one or more electrodes extend between the major surfaces.

Clause 34: The electron beam manipulator of any of clauses 31 to 33, wherein the one or more electrodes are configured to provide an even charge distribution there over.

Clause 35: The electron beam manipulator of any of clause 31 to 34, wherein the one or more electrodes comprise an electrically conductive coating.

Clause 36: An electron beam manipulator configured to manipulate an electron beam in a projection system of an electron beam tool, the charged particle beam manipulator comprising: a substrate having opposing major surfaces and an electrode, wherein the electrode forms at least part of a surface of an interconnecting-through-hole extending between the major surfaces, the through-hole forming an opening in each of the major surfaces, and wherein the electrode forms at least part of one of the two major surfaces surrounding one of the openings.

Clause 37: An electron beam manipulator configured to manipulate an electron beam in a projection system of an electron beam tool, the charged particle beam manipulator comprising: a substrate having opposing major surfaces and a through-passage providing an interconnecting surface extending between the major surfaces, wherein at least part of the interconnecting surface is formed by an electrode configured in use to be held at a potential difference.

Clause 38: The electron beam manipulator of clause 37, wherein the through passage comprises parts of differing cross-sectional area comprising a part having smaller cross-sectional area positioned upstream of the electrode in a path of the electron beam.

Clause 39: The electron beam manipulator of clause 37 or 38, wherein an electrode shield is configured to be upstream of the electrode in a path of the electron beam.

Clause 40: The electron beam manipulator of any of clauses 37 to 39, wherein at least part of the electrode is positioned on one of the major surfaces, and wherein the through passage comprises a shield that is configured to shield the at least part of the electrode.

Clause 41: The electron beam manipulator of any of clauses 37 to 40, wherein at least part of the electrode is positioned on one of the major surfaces, and wherein a part of the passage is configured to shield the at least part of the electrode with respect to a path of the electron beam through the through passage.

Clause 42: An electron beam manipulator configured to manipulate an electron beam in a projection system of an electron beam tool, the charged particle beam manipulator comprising: a substrate body having: opposing major surfaces; and a through-passage having an interconnecting surface extending between the major surfaces, wherein at least part of the interconnecting surface is recessed: between adjoining edges of at least one electrode; and into the substrate body deeper than the thickness of the at least one electrode.

Clause 43: The electron beam manipulator of clause 42, wherein the at least one electrode is made of doped silicon.

The invention claimed is:

1. An electron beam manipulator for manipulating an electron beam in an electron projection system, the electron beam manipulator comprising:
a body having a first surface and a second surface opposing to the first surface and an interconnecting surface extending between the first surface and the second surface and defining an aperture through the body, the body comprising a plurality of electrodes associated with the aperture, the electrodes forming at least part of the interconnecting surface between the first surface and the second surface and at least part of the first surface so that at least part of each of the electrodes is positioned on the first surface,
wherein two adjacent facing surfaces of adjacent electrodes of the plurality of electrodes define a gap having a radial length longer than a radial length of at least one electrode.

2. The electron beam manipulator of claim 1, wherein the plurality of electrodes comprises multiple electrodes isolated from each other.

3. The electron beam manipulator of claim 1, wherein the adjacent facing surfaces defining the gap are radially diverging or have a consistent tangential dimension along their radial length.

4. The electron beam manipulator of claim 1, wherein the plurality of electrodes further form at least part of the second surface.

5. The electron beam manipulator of claim 1, wherein the at least part of each of the plurality of electrodes is configured to have an electric potential different from an electric potential of at least another part of the respective electrode when operating.

6. The electron beam manipulator of claim 1, wherein the body comprises:
a substrate; and
a first electric conductive layer formed on one surface of the substrate and forming at least part of the first surface of the body,
wherein the plurality of electrodes are connected with the first electric conductive layer.

7. The electron beam manipulator of claim 1, wherein the body comprises:
a substrate; and
a plurality of electrode contacts formed on the substrate,
wherein the plurality of electrode contacts are connected with a respective electrode of the plurality of electrodes.

8. The electron beam manipulator of claim 1, wherein the body is formed by a doped silicon substrate forming the first surface, the second surface, and the plurality of electrodes.

9. The electron beam manipulator of claim 8, wherein the body further includes an isolation layer extending between the first surface and the second surface and electrically isolating the plurality of electrodes of the doped silicon substrate from the rest of the doped silicon substrate.

10. The electron beam manipulator of claim 1, wherein the plurality of electrodes comprise metal.

11. The electron beam manipulator of claim 1, wherein the plurality of electrodes comprise an electrically conductive coating.

12. A method for manufacturing an electron beam manipulator, the method comprising:
providing a workpiece comprising a substrate having a first surface and a second surface and an electrode layer formed relative to the first surface, the electrode layer having an electrode portion;
forming a resist mask having an opening corresponding to a pattern on the workpiece, leaving an unmasked portion of the substrate;
etching the unmasked portion of the substrate such that an inner wall is formed through the substrate to extend between the first surface and the second surface;
removing the resist mask; and forming a first conductive layer coating the inner wall of the substrate interconnecting the first and second surfaces, wherein the electrode layer is etched such that the electrode portion includes multiple electrode portions, wherein the electrode portions comprising at least part of an interconnecting surface between the first surface and the second surface and at least part of the electrode layer so that at least part of each of the electrode portions is positioned on the first surface, adjacent electrode portions of the multiple electrode portions being separated via a gap formed by the etching, wherein the gap has a radial length longer than a radial length of at least one electrode portion.

13. The method of claim 12, wherein etching the substrate is performed by using the electrode layer as a stopper and further comprising:

forming a routing resist mask covering a routing portion formed within the electrode layer;

etching a dielectric material; and removing the routing resist mask.

14. An electron beam manipulator configured to manipulate an electron beam in a projection system of an electron beam tool, the electron beam manipulator comprising:

a substrate having opposing major surfaces and a through passage providing an interconnecting surface extending between the major surfaces, at least part of the interconnecting surface being formed by a plurality of electrodes configured in use to be held at a potential difference, at least part of each electrode being positioned on one of the major surfaces and two adjacent facing surfaces of adjacent electrodes of the electrodes defining a gap, and the through passage comprises a shield that is configured to shield the at least part of at least one electrode, wherein the gap has a radial length longer than a radial length of at least one electrode.

15. The electron beam manipulator of claim 14, wherein the through passage comprises parts of differing cross-sectional area comprising a part having smaller cross-sectional area positioned upstream of the at least one electrode in a path of the electron beam.

16. The electron beam manipulator of claim 14, wherein an electrode shield is configured to be upstream of at least one electrode in a path of the electron beam.

17. The electron beam manipulator of claim 14, wherein at least part of the electrode is positioned on one of the major surfaces, and wherein a part of the through passage is configured to shield the at least part of at least one electrode with respect to a path of the electron beam through the through passage.

18. The electron beam manipulator of claim 14, wherein the adjacent facing surfaces defining the gap are radially diverging or have a consistent tangential dimension along their radial length.

19. The electron beam manipulator of claim 14, wherein at least part of the interconnecting surface is coated with a conductive layer that extends to one of the major surfaces.

* * * * *